(12) United States Patent
Kim

(10) Patent No.: US 10,248,243 B2
(45) Date of Patent: Apr. 2, 2019

(54) TOUCH INPUT DEVICE

(71) Applicant: HiDeep Inc., Gyeonggi-do (KR)

(72) Inventor: Jongsik Kim, Gyeonggi-do (KR)

(73) Assignee: HIDEEP INC. (KR)

( * ) Notice: Subject to any disclaimer, the term of this patent is extended or adjusted under 35 U.S.C. 154(b) by 0 days.

(21) Appl. No.: 16/033,319

(22) Filed: Jul. 12, 2018

(65) Prior Publication Data

US 2018/0329561 A1 Nov. 15, 2018

Related U.S. Application Data

(63) Continuation-in-part of application No. 15/835,024, filed on Dec. 7, 2017.

(30) Foreign Application Priority Data

Jan. 19, 2017 (KR) .................. 10-2017-0009299
Jan. 10, 2018 (KR) .................. 10-2018-0003529

(51) Int. Cl.
*G06F 3/041* (2006.01)
*G06F 3/044* (2006.01)
*H03K 17/96* (2006.01)

(52) U.S. Cl.
CPC ............ *G06F 3/0414* (2013.01); *G06F 3/044* (2013.01); *H03K 17/9622* (2013.01);
(Continued)

(58) Field of Classification Search
CPC .... G06F 3/0414; G06F 3/044; H03K 17/9622
See application file for complete search history.

(56) References Cited

U.S. PATENT DOCUMENTS 9,660,646 B1 * 5/2017 Sauer ................. H03K 17/9622
2008/0196945 A1 * 8/2008 Konstas ............. G06F 3/03547
178/18.03
(Continued)

FOREIGN PATENT DOCUMENTS

KR         101516766       5/2015
KR       1020160132671    11/2016
KR         101695212       1/2017

OTHER PUBLICATIONS

Corresponding Office Action issued by the KIPO dated Oct. 17, 2017. KR.
(Continued)

*Primary Examiner* — Kevin M Nguyen
(74) *Attorney, Agent, or Firm* — The Belles Group, P.C.

(57) ABSTRACT

A touch input device may be provided that includes a display module; a substrate which is disposed under the display module; a pressure sensor which is disposed between the display module and the substrate; and a pressure sensing circuit which outputs a predetermined voltage. The touch input device detects the pressure magnitude on the basis of the voltage output from the pressure sensing circuit. The pressure sensing circuit includes a pressure sensing node $N_A$; a switch serially connected between a power voltage $V_{DDA}$ and the pressure sensing node; a current source serially connected between the pressure sensing node and the ground; and an output node $N_o$. The current source is turned on during a first time period t1 every cycle. The switch is turned on every cycle during a third time period t3 separated from the first time period t1 by a predetermined time period.

28 Claims, 18 Drawing Sheets

(52) U.S. Cl.
CPC ............ *G06F 2203/04103* (2013.01); *G06F 2203/04107* (2013.01); *H03K 2017/9604* (2013.01)

(56) References Cited

U.S. PATENT DOCUMENTS

| | | | |
|---|---|---|---|
| 2014/0043288 A1* | 2/2014 | Kurasawa | G06F 3/0412 345/174 |
| 2014/0292718 A1* | 10/2014 | Noguchi | G02F 1/13338 345/174 |
| 2016/0334914 A1 | 11/2016 | Kim et al. | |
| 2017/0262112 A1* | 9/2017 | Noguchi | G06F 3/044 |
| 2018/0018036 A1 | 1/2018 | Huang et al. | |

OTHER PUBLICATIONS

USPTO Office Action dated Nov 30, 2018 issued in related parent application.

\* cited by examiner $$V_o = \left(-\frac{C_1}{C_2}\right) * V_A + \left(\frac{C_1}{C_1+C_2}\right)\left(1+\frac{C_1}{C_2}\right) * V_A = 0$$

$$V_o = \left(-\frac{C_1}{C_2}\right) * V_A + \left(1+\frac{C_1}{C_2}\right) * (V_{DRV.H} - V_{DRV.L})$$

TOUCH INPUT DEVICE

CROSS REFERENCE TO RELATED APPLICATIONS

The present application is a continuation in part of U.S. application Ser. No. 15/835,024, filed Dec. 7, 2017, which claims priority under 35 U.S.C. § 119 to Korean Patent Application No. 10-2017-0009299, filed Jan. 19, 2017. The present application further claims priority under 35 U.S.C. § 119 to Korean Patent Application No. 10-2018-0003529, filed Jan. 10, 2018, which claims priority to Korean Patent Application No. 10-2017-0009299. The disclosures of the aforementioned priority applications are incorporated herein by reference in their entirety.

BACKGROUND

Field

The present disclosure relates to a touch input device and more particularly to a touch input device capable of minimizing noise introduced through a pressure sensor and of uniformly maintaining a pressure sensing sensitivity.

Description of Related Art

Various kinds of input devices are being used to operate a computing system. For example, the input device includes a button, key, joystick and touch screen. Since the touch screen is easy and simple to operate, the touch screen is increasingly being used in operation of the computing system.

A touch surface of a touch input device such as the touch screen may be composed of a transparent panel including a touch-sensitive surface and of a touch sensor, i.e., a touch input means. The touch sensor is attached to the front side of a display screen, and then the touch-sensitive surface may cover the visible side of the display screen. The touch screen allows a user to operate the computing system by simply touching the touch screen by a finger, etc. Generally, the computing system recognizes the touch and a position of the touch on the touch screen and analyzes the touch, and thus, thereby performing the operations.

BRIEF SUMMARY

One embodiment is a touch input device which detects a pressure magnitude of an input touch. The touch input device includes: a display module; a substrate which is disposed under the display module; a pressure sensor which is disposed between the display module and the substrate; and a pressure sensing circuit which outputs a predetermined voltage. The touch input device detects the pressure magnitude on the basis of the voltage output from the pressure sensing circuit. The touch input device detects the pressure magnitude on the basis of the voltage output from the pressure sensing circuit. The pressure sensing circuit includes: a pressure sensing node $N_A$ which has the same voltage as a voltage applied to the pressure sensor; a switch serially connected between a power voltage $V_{DDA}$ and the pressure sensing node; a current source serially connected between the pressure sensing node and the ground; and an output node $N_o$ which is connected to the pressure sensing node and outputs an output signal. The current source and the switch are turned on and turned off one or more times every cycle. The current source is turned on during a first time period t1 every cycle. The switch is turned on every cycle during a third time period t3 separated from the first time period t1 by a predetermined time period.

Another embodiment is a touch input device which detects a pressure magnitude of an input touch. The touch input device that includes: a display module; a substrate which is disposed under the display module; a pressure sensor which is disposed between the display module and the substrate; and a pressure sensing circuit which outputs a predetermined voltage. The touch input device detects the pressure magnitude on the basis of the voltage output from the pressure sensing circuit. The pressure sensing circuit includes: a pressure sensing node $N_A$ which has the same voltage as a voltage applied to the pressure sensor; a current source serially connected between a power voltage $V_{DDA}$ and the pressure sensing node; a switch serially connected between the pressure sensing node and the ground; and an output node $N_o$ which is connected to the pressure sensing node and outputs an output signal. The current source and the switch are turned on and turned off one or more times every cycle. The current source is turned on during a first time period t1 every cycle. The switch is turned on every cycle during a third time period t3 separated from the first time period t1 by a predetermined time period.

Further another embodiment is a touch input device which detects a pressure magnitude of an input touch. The touch input device includes: a display module; a substrate which is disposed under the display module; a pressure sensor which is disposed between the display module and the substrate; and a pressure sensing circuit which outputs a predetermined voltage. The touch input device detects the pressure magnitude on the basis of the voltage output from the pressure sensing circuit. The pressure sensing circuit includes: a pressure sensing node $N_A$ which has the same voltage as a voltage applied to the pressure sensor; a first current source serially connected between a power voltage $V_{DDA}$ and the pressure sensing node; a second current source serially connected between the first current source and the ground; and an output node $N_o$ which is connected to the pressure sensing node and outputs an output signal. The first current source and the second current source are turned on and turned off one or more times every cycle. The first current source is turned on during a first time period t1 every cycle. The second current source is turned on every cycle during a third time period t3 separated from the first time period t1 by a predetermined time period.

DETAILED DESCRIPTION

Figure 1A:
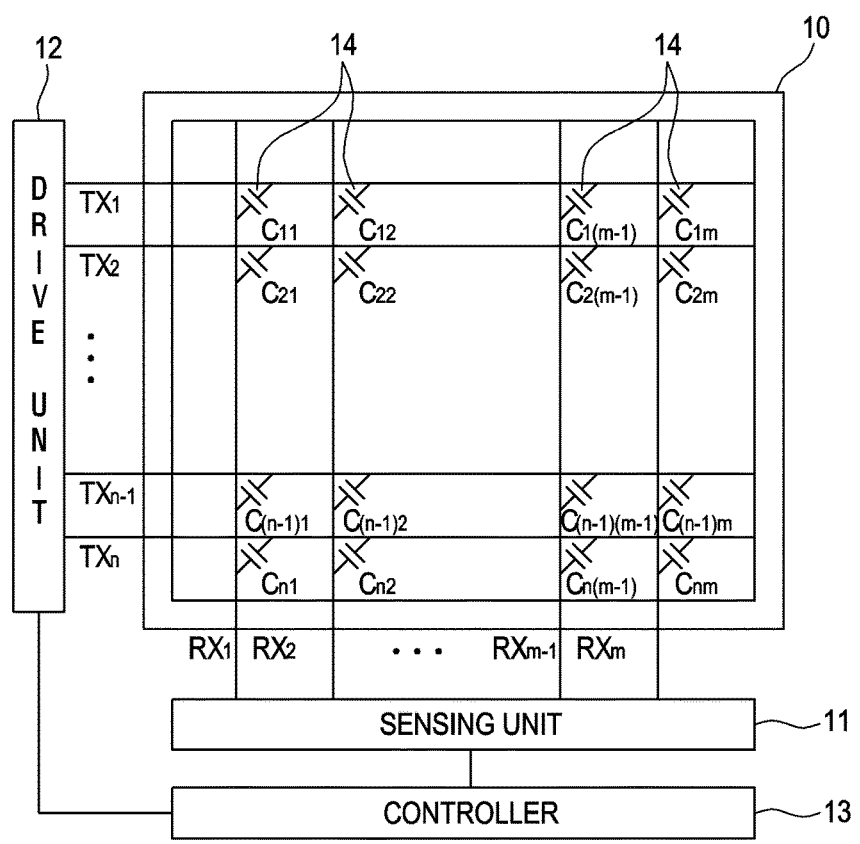
FIGS. 1a and 1b are schematic views showing a capacitance type touch sensor included in a touch input device and the configuration for the operation of the capacitance type touch sensor in accordance with an embodiment of the present invention.

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. Similar reference numerals in the drawings designate the same or similar functions in many aspects.

Hereafter, a touch input device capable of detecting a pressure in accordance with an embodiment of the present invention will be described. Hereafter, while a capacitance type touch sensor 10 is exemplified below, the touch sensor 10 capable of detecting a touch position in any manner may be applied.

FIG. 1a is schematic views of a configuration of the capacitance type touch sensor 10 included in the touch input device according to the embodiment of the present invention and the operation of the capacitance type touch sensor. Referring to FIG. 1a, the touch sensor 10 may include a plurality of drive electrodes TX1 to TXn and a plurality of receiving electrodes RX1 to RXm, and may include a drive unit 12 which applies a drive signal to the plurality of the drive electrodes TX1 to TXn for the purpose of the operation of the touch sensor 10, and a sensing unit 11 which detects the touch and the touch position by receiving from the plurality of the receiving electrodes RX1 to RXm a sensing signal including information on a capacitance change amount changing according to the touch on a touch surface.

As shown in FIG. 1a, the touch sensor 10 may include the plurality of drive electrodes TX1 to TXn and the plurality of receiving electrodes RX1 to RXm. While FIG. 1a shows that the plurality of drive electrodes TX1 to TXn and the plurality of receiving electrodes RX1 to RXm of the touch sensor 10 form an orthogonal array, the present invention is not limited to this. The plurality of drive electrodes TX1 to TXn and the plurality of receiving electrodes RX1 to RXm has an array of arbitrary dimension, for example, a diagonal array, a concentric array, a 3-dimensional random array, etc., and an array obtained by the application of them. Here, "n" and "m" are positive integers and may be the same as each other or may have different values. The magnitude of the value may be changed depending on the embodiment.

The plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

Figure 7A:
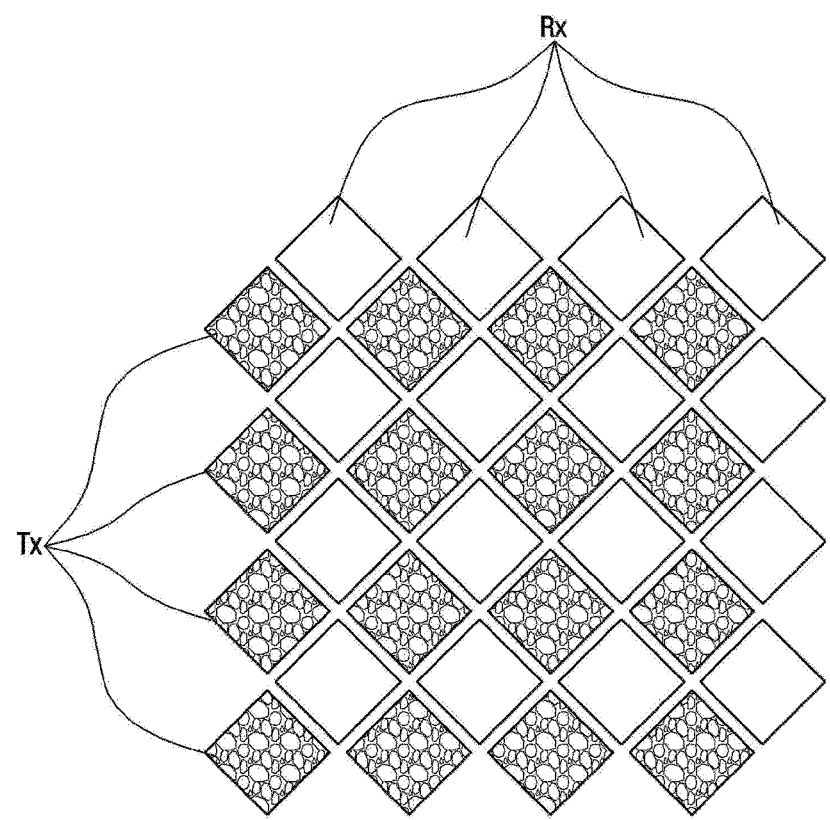
FIGS. 7a to 7d are views showing a form of a sensor included in the touch input device according to the embodiment of the present invention.
Figure 7B:
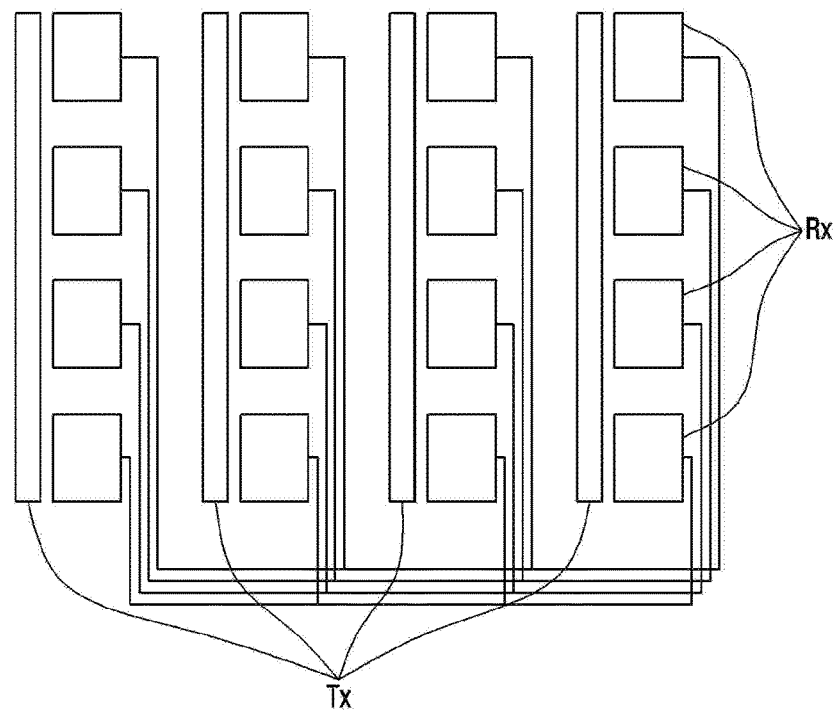

As shown in FIGS. 7a and 7b, in the touch sensor 10 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on a top surface of a display panel 200A to be described later.

Figure 7C:
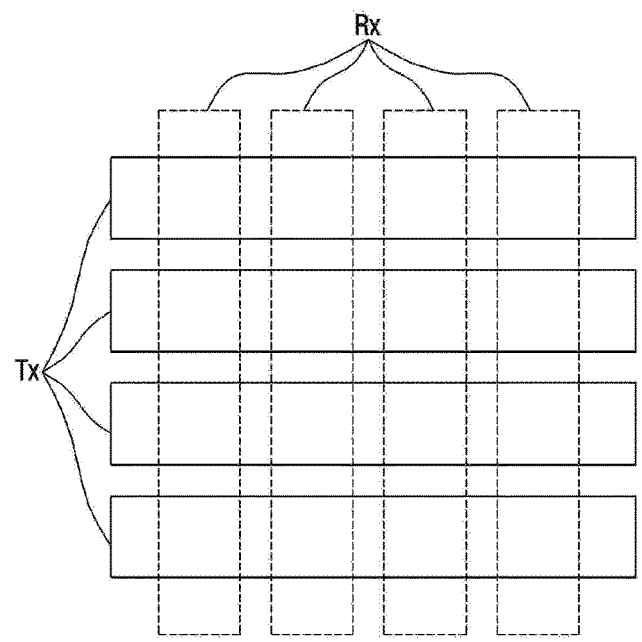

Also, as shown in FIG. 7c, the plurality of drive electrodes TX1 to TXn and the plurality of receiving electrodes RX1 to RXm may be formed in different layers. For example, any one of the plurality of drive electrodes TX1 to TXn and the plurality of receiving electrodes RX1 to RXm may be formed on the top surface of the display panel 200A, and the other may be formed on a bottom surface of a cover to be described later or may be formed within the display panel 200A.

The plurality of drive electrodes TX1 to TXn and the plurality of receiving electrodes RX1 to RXm may be made of a transparent conductive material (for example, indium tin oxide (ITO) or antimony tin oxide (ATO) which is made of tin oxide ($SnO_2$), and indium oxide ($In_2O_3$), etc.), or the like. However, this is only an example. The drive electrode TX and the receiving electrode RX may be also made of another transparent conductive material or an opaque conductive material. For instance, the drive electrode TX and the receiving electrode RX may include at least any one of silver ink, copper, and carbon nanotube (CNT). Also, the drive electrode TX and the receiving electrode RX may be made of metal mesh.

The drive unit 12 according to the embodiment of the present invention may apply a drive signal to the drive electrodes TX1 to TXn. In the embodiment of the present invention, one drive signal may be sequentially applied at a time to the first drive electrode TX1 to the n-th drive electrode TXn. The drive signal may be applied again repeatedly. This is only an example. The drive signal may be applied to the plurality of drive electrodes at the same time in accordance with the embodiment.

Through the receiving electrodes RX1 to RXm, the sensing unit 11 receives the sensing signal including information on a capacitance (Cm) 14 generated between the receiving electrodes RX1 to RXm and the drive electrodes TX1 to TXn to which the driving signal has been applied, thereby detecting whether or not the touch has occurred and where the touch has occurred. For example, the sensing signal may be a signal coupled by the capacitance (Cm) 14 generated between the receiving electrode RX and the drive electrode TX to which the driving signal has been applied. As such, the process of sensing the driving signal applied from the first drive electrode TX1 to the n-th drive electrode TXn through the receiving electrodes RX1 to RXm can be referred to as a process of scanning the touch sensor 10.

For example, the sensing unit 11 may include a receiver (not shown) which is connected to each of the receiving electrodes RX1 to RXm through a switch. The switch becomes the on-state in a time interval during which the signal of the corresponding receiving electrode RX is sensed, thereby allowing the receiver to sense the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here, the positive (+) input terminal of the amplifier may be connected to the ground. Also, the receiver may further include a reset switch which is connected in parallel with the feedback capacitor. The reset switch may reset the conversion from current to voltage that is performed by the receiver. The negative input terminal of the amplifier is connected to the corresponding receiving electrode RX and receives and integrates a current signal including information on the capacitance (Cm) 14, and then converts the integrated current signal into voltage. The sensing unit 11 may further include an analog to digital converter (ADC) (not shown) which converts the integrated data by the receiver into digital data. Later, the digital data may be input to a processor (not shown) and processed to obtain information on the touch on the touch sensor 10. The sensing unit 11 may include the ADC and processor as well as the receiver.

A controller 13 may perform a function of controlling the operations of the drive unit 12 and the sensing unit 11. For example, the controller 13 generates and transmits a drive control signal to the drive unit 12, so that the driving signal can be applied to a predetermined drive electrode TX1 at a predetermined time. Also, the controller 13 generates and transmits the drive control signal to the sensing unit 11, so that the sensing unit 11 may receive the sensing signal from the predetermined receiving electrode RX at a predetermined time and perform a predetermined function.

In FIG. 1a, the drive unit 12 and the sensing unit 11 may constitute a touch detection device (not shown) capable of detecting whether the touch has occurred on the touch sensor 10 or not and where the touch has occurred. The touch detection device may further include the controller 13. In the touch input device including the touch sensor 10, the touch detection device may be integrated and implemented on a touch sensing integrated circuit (IC) corresponding to a below-described touch sensor controller 1100. The drive electrode TX and the receiving electrode RX included in the touch sensor 10 may be connected to the drive unit 12 and the sensing unit 11 included in the touch sensing IC through, for example, a conductive trace and/or a conductive pattern printed on a circuit board, or the like. The touch sensing IC may be placed on a circuit board on which the conductive pattern has been printed, for example, a touch circuit board (hereafter, referred to as a touch PCB). According to the embodiment, the touch sensing IC may be mounted on a main board for operation of the touch input device.

As described above, a capacitance (Cm) with a predetermined value is generated at each crossing of the drive electrode TX and the receiving electrode RX. When an object like a finger approaches close to the touch sensor 10, the value of the capacitance may be changed. In FIG. 1a, the capacitance may represent a mutual capacitance (Cm). The sensing unit 11 senses such electrical characteristics, thereby being able to sense whether the touch has occurred on the touch sensor 10 or not and where the touch has occurred. For example, the sensing unit 11 is able to sense whether the touch has occurred on the surface of the touch sensor 10 comprised of a two-dimensional plane consisting of a first axis and a second axis.

More specifically, when the touch occurs on the touch sensor 10, the drive electrode TX to which the driving signal has been applied is detected, so that the position of the second axial direction of the touch can be detected. Likewise, when the touch occurs on the touch sensor 10, the capacitance change is detected from the reception signal received through the receiving electrode RX, so that the position of the first axial direction of the touch can be detected.

Up to now, although the operation mode of the touch sensor 10 sensing the touch position has been described on the basis of the mutual capacitance change amount between the drive electrode TX and the receiving electrode RX, the embodiment of the present invention is not limited to this. That is, as shown in FIG. 1b, it is also possible to detect the touch position on the basis of the change amount of a self-capacitance.

Figure 1B:
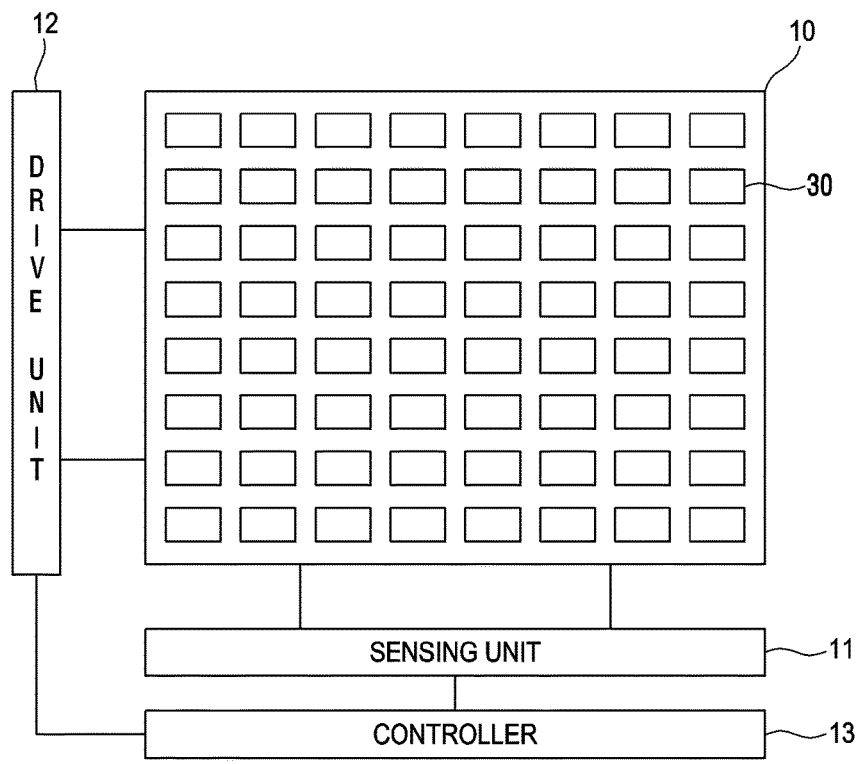
Figure 7D:
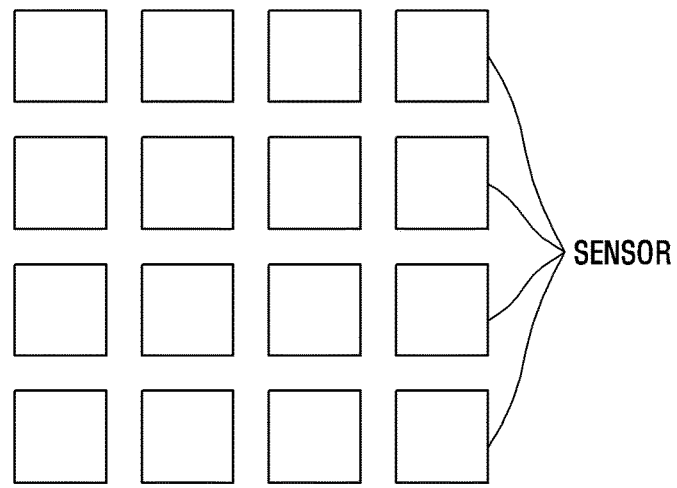

FIG. 1b is schematic views of a configuration of another capacitance type touch sensor 10 included in the touch input device according to another embodiment of the present invention and the operation of the capacitance type touch sensor. A plurality of touch electrodes 30 are provided on the touch sensor 10 shown in FIG. 1b. Although the plurality of touch electrodes 30 may be, as shown in FIG. 7d, disposed at a regular interval in the form of a grid, the present invention is not limited to this.

The drive control signal generated by the controller 13 is transmitted to the drive unit 12. On the basis of the drive control signal, the drive unit 12 applies the drive signal to the predetermined touch electrode 30 during a predetermined time period. Also, the drive control signal generated by the controller 13 is transmitted to the sensing unit 11. On the basis of the drive control signal, the sensing unit 11 receives the sensing signal from the predetermined touch electrode 30 during a predetermined time period. Here, the sensing signal may be a signal for the change amount of the self-capacitance formed on the touch electrode 30.

Here, whether the touch has occurred on the touch sensor 10 or not and/or the touch position are detected by the sensing signal detected by the sensing unit 11. For example, since the coordinate of the touch electrode 30 has been known in advance, whether the touch of the object on the surface of the touch sensor 10 has occurred or not and/or the touch position can be detected.

In the foregoing, for convenience of description, it has been described that the drive unit 12 and the sensing unit 11 operate individually as a separate block. However, the operation to apply the drive signal to the touch electrode 30 and to receive the sensing signal from the touch electrode 30 can be also performed by one drive and sensing unit.

The foregoing has described in detail the capacitance type touch sensor as the touch sensor 10. However, in the touch input device 1000 according to the embodiment of the present invention, the touch sensor 10 for detecting whether or not the touch has occurred and the touch position may be implemented by using not only the above-described method but also any touch sensing method such as a surface capacitance type method, a projected capacitance type method, a resistance film method, a surface acoustic wave (SAW) method, an infrared method, an optical imaging method, a dispersive signal technology, and an acoustic pulse recognition method, etc.

Figure 2:
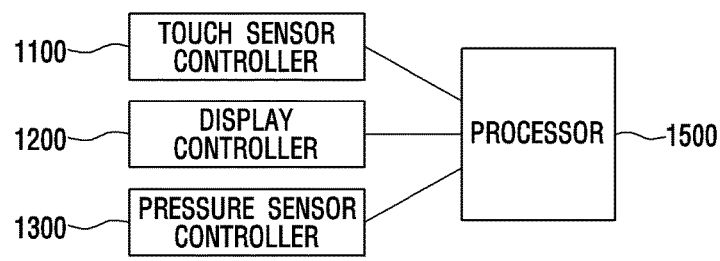
FIG. 2 shows a control block for controlling a touch position, a touch pressure, and a display operation in the touch input device according to the embodiment of the present invention.

FIG. 2 shows a control block for controlling the touch position, a touch pressure and a display operation in the touch input device according to the embodiment of the present invention. In the touch input device 1000 configured to detect the touch pressure in addition to the display function and touch position detection, the control block may include the above-described touch sensor controller 1100 for detecting the touch position, a display controller 1200 for driving the display panel, and a pressure sensor controller 1300 for detecting the pressure. The display controller 1200 may include a control circuit which receives an input from an application processor (AP) or a central processing unit (CPU) on a main board for the operation of the touch input device 1000 and displays the contents that the user wants on the display panel 200A. The control circuit may be mounted on a display circuit board (hereafter, referred to as a display PCB). The control circuit may include a display panel control IC, a graphic controller IC, and a circuit required to operate other display panel 200A.

The pressure sensor controller 1300 for detecting the pressure through a pressure sensing unit may be configured similarly to the touch sensor controller 1100, and thus, may operate similarly to the touch sensor controller 1100. Specifically, as shown in FIGS. 1a and 1b, the pressure sensor controller 1300 may include the drive unit, the sensing unit, and the controller, and may detect a magnitude of the pressure by the sensing signal sensed by the sensing unit. Here, the pressure sensor controller 1300 may be mounted on the touch PCB on which the touch sensor controller 1100 has been mounted or may be mounted on the display PCB on which the display controller 1200 has been mounted.

According to the embodiment, the touch sensor controller 1100, the display controller 1200, and the pressure sensor controller 1300 may be included as different components in the touch input device 1000. For example, the touch sensor controller 1100, the display controller 1200, and the pressure sensor controller 1300 may be composed of different chips respectively. Here, a processor 1500 of the touch input device 1000 may function as a host processor for the touch sensor controller 1100, the display controller 1200, and the pressure sensor controller 1300.

According to another embodiment of the present invention, the touch sensor controller 1100, the display controller 1200, and the pressure sensor controller 1300 may be included as one component in the touch input device 1000. For example, the touch sensor controller 1100, the display controller 1200, and the pressure sensor controller 1300 may be included in one chip.

The touch input device 1000 according to the embodiment of the present invention may include an electronic device including a display screen and/or a touch screen, such as a cell phone, a personal data assistant (PDA), a smartphone, a tablet personal computer (PC).

In order to manufacture such a thin and lightweight light-weighing touch input device 1000, the touch sensor controller 1100, the display controller 1200, and the pressure sensor controller 1300, which are, as described above, formed separately from each other, may be integrated into one or more configurations in accordance with the embodiment of the present invention. In addition to this, these controllers can be integrated into the processor 1500 respectively. Also, according to the embodiment of the present invention, the touch sensor 10 and/or the pressure sensing unit may be integrated into the display panel 200A.

In the touch input device 1000 according to the embodiment of the present invention, the touch sensor 10 for detecting the touch position may be positioned outside or inside the display panel 200A. The display panel 200A of the touch input device 1000 according to the embodiment of the present invention may be a display panel included in a liquid crystal display (LCD), a plasma display panel (PDP), an organic light emitting diode (OLED), etc. Accordingly, a user may perform the input operation by touching the touch surface while visually identifying an image displayed on the display panel.

Figure 3A:
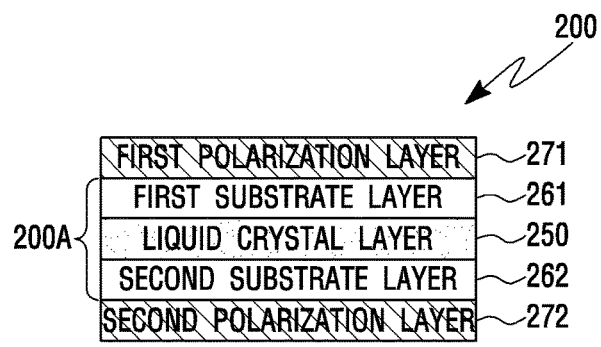
FIGS. 3a to 3b are conceptual views for describing the configuration of a display module in the touch input device according to the embodiment of the present invention.
Figure 3B:
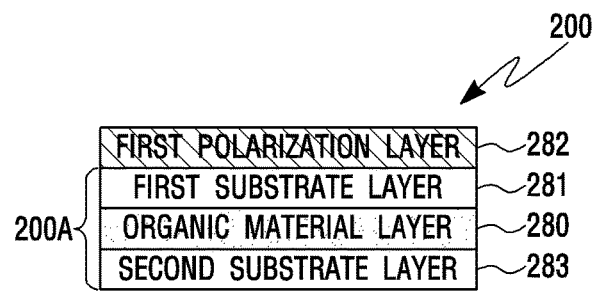

FIGS. 3a and 3b are conceptual views for describing a configuration of a display module 200 in the touch input device 1000 according to the embodiment of the present invention. First, the configuration of the display module 200 including the display panel 200A using an LCD panel will be described with reference to FIG. 3a.

As shown in FIG. 3a, the display module 200 may include the display panel 200A that is an LCD panel, a first polarization layer 271 disposed on the display panel 200A, and a second polarization layer 272 disposed under the display panel 200A. The display panel 200A that is an LCD panel may include a liquid crystal layer 250 including a liquid crystal cell, a first substrate layer 261 disposed on the liquid crystal layer 250, and a second substrate layer 262 disposed under the liquid crystal layer 250. Here, the first substrate layer 261 may be made of color filter glass, and the second substrate layer 262 may be made of TFT glass. Also, according to the embodiment, at least one of the first substrate layer 261 and the second substrate layer 262 may be made of a bendable material such as plastic. In FIG. 3a, the second substrate layer 262 may be comprised of various layers including a data line, a gate line, TFT, a common electrode, and a pixel electrode, etc. These electrical components may operate in such a manner as to generate a controlled electric field and orient liquid crystals located in the liquid crystal layer 250.

Next, the configuration of the display module 200 including the display panel 200A using an OLED panel will be described with reference to FIG. 3b.

As shown in FIG. 3b, the display module 200 may include the display panel 200A that is an OLED panel, and a first polarization layer 282 disposed on the display panel 200A. The display panel 200A that is an OLED panel may include an organic material layer 280 including an organic light-emitting diode (OLED), a first substrate layer 281 disposed on the organic material layer 280, and a second substrate layer 283 disposed under the organic material layer 280. Here, the first substrate layer 281 may be made of encapsulation glass, and the second substrate layer 283 may be made of TFT glass. Also, according to the embodiment, at least one of the first substrate layer 281 and the second substrate layer 283 may be made of a bendable material such as plastic. The OLED panel shown in FIG. 3b may include an electrode used to drive the display panel 200A, such as a gate line, a data line, a first power line (ELVDD), a second power line (ELVSS), etc. The organic light-emitting diode (OLED) panel is a self-light emitting display panel which uses a principle where, when current flows through a fluorescent or phosphorescent organic thin film and then electrons and electron holes are combined in the organic material layer, so that light is generated. The organic material constituting the light emitting layer determines the color of the light.

Specifically, the OLED uses a principle in which when electricity flows and an organic matter is applied on glass or plastic, the organic matter emits light. That is, the principle is that electron holes and electrons are injected into the anode and cathode of the organic matter respectively and are recombined in the light emitting layer, so that a high energy exciton is generated and the exciton releases the energy while falling down to a low energy state and then light with a particular wavelength is generated. Here, the color of the light is changed according to the organic matter of the light emitting layer.

The OLED includes a line-driven passive-matrix organic light-emitting diode (PM-OLED) and an individual driven active-matrix organic light-emitting diode (AM-OLED) in accordance with the operating characteristics of a pixel constituting a pixel matrix. None of them require a backlight. Therefore, the OLED enables a very thin display module to be implemented, has a constant contrast ratio according to an angle and obtains a good color reproductivity depending on a temperature. Also, it is very economical in that non-driven pixel does not consume power.

In terms of operation, the PM-OLED emits light only during a scanning time at a high current, and the AM-OLED maintains a light emitting state only during a frame time at a low current. Therefore, the AM-OLED has a resolution higher than that of the PM-OLED and is advantageous for driving a large area display panel and consumes low power. Also, a thin film transistor (TFT) is embedded in the AM-OLED, and thus, each component can be individually controlled, so that it is easy to implement a delicate screen.

Also, the organic material layer 280 may include a hole injection layer (HIL), a hole transport layer (HTL), an electron injection layer (EIL), an electron transport layer (ETL), and an light-emitting layer (EML).

Briefly describing each of the layers, HIL injects electron holes and is made of a material such as CuPc, etc. HTL functions to move the injected electron holes and mainly is made of a material having a good hole mobility. The HTL may be made of Arylamine, TPD, and the like. The EIL and ETL inject and transport electrons. The injected electrons and electron holes are combined in the EML and emit light. The EML represents the color of the emitted light and is composed of a host determining the lifespan of the organic matter and an impurity (dopant) determining the color sense and efficiency. This just describes the basic structure of the organic material layer 280 include in the OLED panel. The present invention is not limited to the layer structure or material, etc., of the organic material layer 280.

The organic material layer 280 is inserted between an anode (not shown) and a cathode (not shown). When the TFT becomes an on-state, a driving current is applied to the anode and the electron holes are injected, and the electrons are injected to the cathode. Then, the electron holes and electrons move to the organic material layer 280 and emit the light.

It will be apparent to a skilled person in the art that the LCD panel or the OLED panel may further include other structures so as to perform the display function and may be deformed.

The display module 200 of the touch input device 1000 according to the embodiment of the present invention may include the display panel 200A and a configuration for driving the display panel 200A. Specifically, when the display panel 200A is an LCD panel, the display module 200 may include a backlight unit (not shown) disposed under the second polarization layer 272 and may further include a display panel control IC for operation of the LCD panel, a graphic control IC, and other circuits.

The display module 200 of the touch input device 1000 according to the embodiment of the present invention may include the display panel 200A shown in FIG. 3a and a configuration for driving the display panel 200A shown in FIG. 3b. Specifically, when the display panel 200A is an LCD panel, the display module 200 may include a backlight unit (not shown) disposed under the second polarization layer 272 and may further include a display panel control IC for operation of the LCD panel, a graphic control IC, and other circuits.

In the touch input device 1000 according to the embodiment of the present invention, the touch sensor 10 for detecting the touch position may be positioned outside or inside the display module 200.

When the touch sensor 10 in the touch input device 1000 positioned outside the display module 200, the touch sensor panel may be disposed on the display module 200, and the touch sensor 10 may be included in the touch sensor panel. The touch surface of the touch input device 1000 may be the surface of the touch sensor panel.

When the touch sensor 10 in the touch input device 1000 positioned inside the display module 200, the touch sensor 10 may be configured to be positioned outside the display panel 200A. Specifically, the touch sensor 10 may be formed on the top surfaces of the first substrate layers 261 and 281. Here, the touch surface of the touch input device 1000 may be an outer surface of the display module 200 and may be the top surface or bottom surface in FIGS. 3 and 3b.

When the touch sensor 10 in the touch input device 1000 positioned inside the display module 200, at least a portion of the touch sensor 10 may be configured to be positioned inside the display panel 200A, and at least a portion of the remaining touch sensor 10 may be configured to be positioned outside the display panel 200A. For example, any one of the drive electrode TX and the receiving electrode RX, which constitute the touch sensor 10, may be configured to be positioned outside the display panel 200A, and the other may be configured to be positioned inside the display panel 200A. Specifically, any one of the drive electrode TX and the receiving electrode RX, which constitute the touch sensor 10, may be formed on the top surface of the top surfaces of the first substrate layers 261 and 281, and the other may be formed on the bottom surfaces of the first substrate layers 261 and 281 or may be formed on the top surfaces of the second substrate layers 262 and 283.

When the touch sensor 10 in the touch input device 1000 positioned inside the display module 200, the touch sensor 10 may be configured to be positioned inside the display panel 200A. Specifically, the touch sensor 10 may be formed on the bottom surfaces of the first substrate layers 261 and 281 or may be formed on the top surfaces of the second substrate layers 262 and 283.

When the touch sensor 10 is positioned inside the display panel 200A, an electrode for operation of the touch sensor may be additionally disposed. However, various configurations and/or electrodes positioned inside the display panel 200A may be used as the touch sensor 10 for sensing the touch. Specifically, when the display panel 200A is the LCD panel, at least any one of the electrodes included in the touch sensor 10 may include at least any one of a data line, a gate line, TFT, a common electrode (Vcom), and a pixel electrode. When the display panel 200A is the OLED panel, at least any one of the electrodes included in the touch sensor 10 may include at least any one of a data line, a gate line, a first power line (ELVDD), and a second power line (ELVSS).

Here, the touch sensor 10 may function as the drive electrode and the receiving electrode described in FIG. 1a and may detect the touch position in accordance with the mutual capacitance between the drive electrode and the receiving electrode. Also, the touch sensor 10 may function as the single electrode 30 described in FIG. 1b and may detect the touch position in accordance with the self-capacitance of each of the single electrodes 30. Here, if the electrode included in the touch sensor 10 is used to drive the display panel 200A, the display panel 200A may be driven in a first time interval and the touch position may be detected in a second time interval different from the first time interval.

In the touch input device 1000 according to the embodiment of the present invention, by means of an adhesive like an optically clear adhesive (OCA), lamination may occur between a cover layer 100 on which the touch sensor for detecting the touch position has been formed and the display module 200 including the display panel 200A. As a result, the display color clarity, visibility and optical transmittance of the display module 200, which can be recognized through the touch surface of the touch sensor, can be improved.

FIGS. 4a, 4b and 4d to 4g are cross sectional views of the touch input device according to the embodiment of the present invention. FIG. 4c is an exploded perspective view of the touch input device according to the embodiment of the present invention.

Figure 4A:
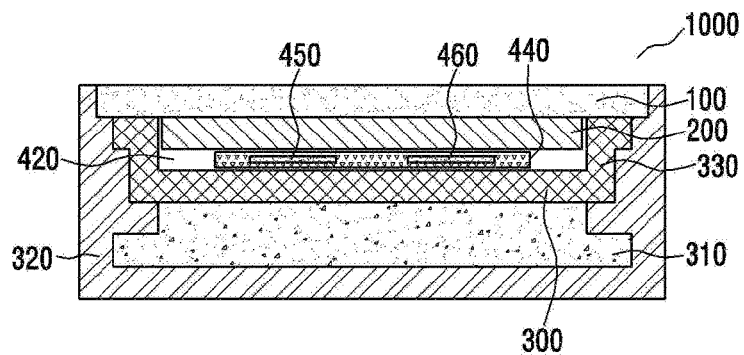
FIGS. 4a, 4b and 4d to 4g are cross sectional views of the touch input device according to the embodiment of the present invention.

In FIG. 4a and some of the following figures, it is shown that the display panel 200A is directly laminated on and attached to the cover layer 100. However, this is only for convenience of description. The display module 200 where the first polarization layers 271 and 282 is located on the display panel 200A may be laminated on and attached to the cover layer 100. When the LCD panel is the display panel 200A, the second polarization layer 272 and the backlight unit are omitted.

Figure 4B:
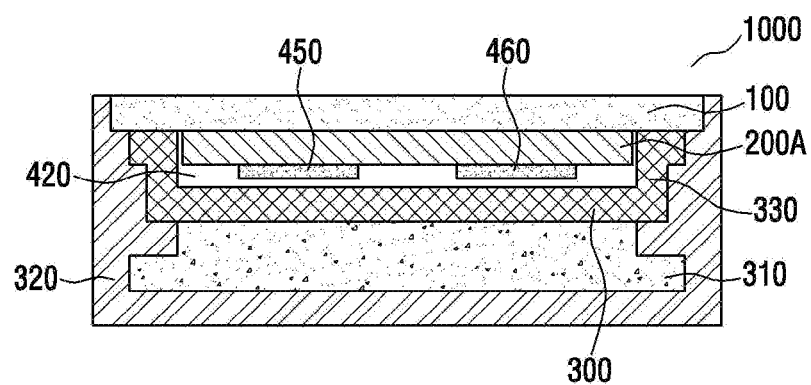
Figure 4C:
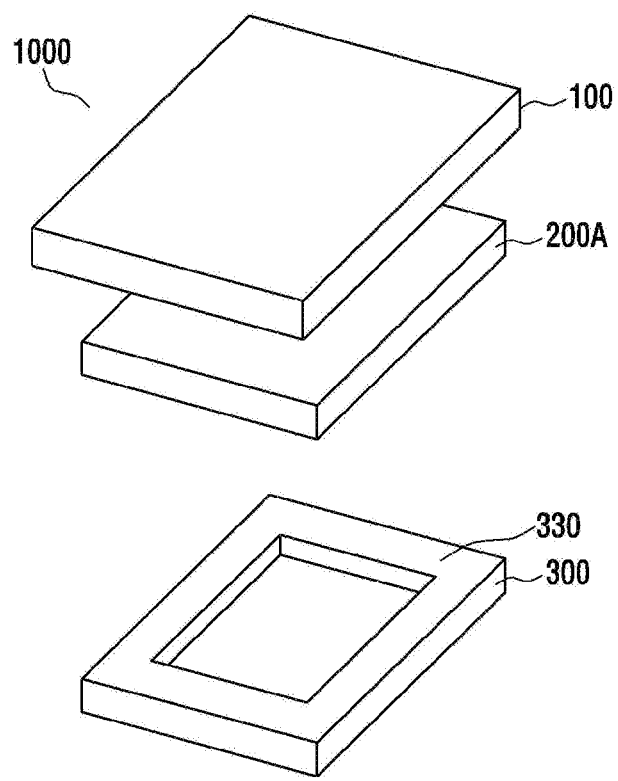
FIG. 4c is an exploded perspective view of the touch input device according to the embodiment of the present invention.

In the description with reference to FIGS. 4a to 4g, it is shown that as the touch input device 1000 according to the embodiment of the present invention, the cover layer 100 in which the touch sensor 10 has been formed is laminated on and attached to the display module 200 shown in FIGS. 3a and 3b by means of an adhesive. However, the touch input device 1000 according to the embodiment of the present invention may include that the touch sensor 10 is disposed inside the display module 200 shown in FIGS. 3a and 3b. More specifically, while FIGS. 4a to 4c show that the cover layer 100 where the touch sensor 10 has been formed covers the display module 200 including the display panel 200A, the touch input device 1000 which includes the touch sensor 10 disposed inside the display module 200 and includes the display module 200 covered with the cover layer 100 like glass may be used as the embodiment of the present invention.

The touch input device 1000 according to the embodiment of the present invention may include an electronic device including the touch screen, for example, a cell phone, a personal data assistant (PDA), a smart phone, a tablet personal computer, an MP3 player, a laptop computer, etc.

In the touch input device 1000 according to the embodiment of the present invention, a substrate 300, together with an outermost housing 320 of the touch input device 1000, may function to surround a mounting space 310, etc., where the circuit board and/or battery for operation of the touch input device 1000 are placed. Here, the circuit board for operation of the touch input device 1000 may be a main board. A central processing unit (CPU), an application processor (AP) or the like may be mounted on the circuit board. Due to the substrate 300, the display module 200 is separated from the circuit board and/or battery for operation of the touch input device 1000. Due to the substrate 300, electrical noise generated from the display module 200 and noise generated from the circuit board can be blocked.

The touch sensor 10 or the cover layer 100 of the touch input device 1000 may be formed wider than the display module 200, the substrate 300, and the mounting space 310. As a result, the housing 320 may be formed such that the housing 320, together with the touch sensor 10, surrounds the display module 200, the substrate 300, and the circuit board.

The touch input device 1000 according to the embodiment of the present invention may detect the touch position through the touch sensor 10 and may detect the touch pressure by using a separate sensor as the pressure sensing unit, which is different from the electrode used to detect the touch position and the electrode used to drive the display. Here, the touch sensor 10 may be disposed inside or outside the display module 200.

Hereafter, the components for detecting the pressure are collectively referred to as the pressure sensing unit. For example, the pressure sensing unit of the embodiment shown in FIG. 4a may include a sensor sheet 440, and the pressure sensing unit of the embodiment shown in FIG. 4b may include pressure sensors 450 and 460.

In the touch input device according to the embodiment of the present invention, as shown in FIG. 4a, the sensor sheet 440 including the pressure sensors 450 and 460 may be disposed between the display module 200 and the substrate 300, or alternatively, as shown in FIG. 4b, the pressure sensors 450 and 460 may be directly formed on the bottom surface of the display panel 200A.

Also, the pressure sensing unit is formed to include, for example, a spacer layer 420 composed of an air gap. This will be described in detail with reference to FIGS. 4a to 4g.

According to the embodiment, the spacer layer 420 may be implemented by the air gap. According to the embodiment, the spacer layer 420 may be made of an impact absorbing material. According to the embodiment, the spacer layer 420 may be filled with a dielectric material. According to the embodiment, the spacer layer 420 may be made of a material having a restoring force by which the material contracts by applying the pressure and returns to its original shape by releasing the pressure. According to the embodiment, the spacer layer 420 may be made of elastic foam. Also, since the spacer layer 420 is disposed under the display module 200, the spacer layer may be made of a transparent material or an opaque material.

Also, a reference potential layer may be disposed under the display module 200. Specifically, the reference potential layer may be formed on the substrate 300 disposed under the display module 200. Alternatively, the substrate 300 itself may serve as the reference potential layer. Also, the reference potential layer may be disposed on the cover (not shown) which is disposed on the substrate 300 and under the display module 200 and functions to protect the display module 200. Alternatively, the cover itself may serve as the reference potential layer. When a pressure is applied to the touch input device 1000, the display panel 200A is bent. Due to the bending of the display panel 200A, a distance between the reference potential layer and the pressure sensor 450 and 460 may be changed. Also, the spacer layer may be disposed between the reference potential layer and the pressure sensor 450 and 460. Specifically, the spacer layer may be disposed between the display module 200 and the substrate 300 where the reference potential layer has been disposed or between the display module 200 and the cover where the reference potential layer has been disposed.

Also, the reference potential layer may be disposed inside the display module 200. Specifically, the reference potential layer may be disposed on the top surfaces or bottom surfaces of the first substrate layers 261 and 281 of the display panel 200A or on the top surfaces or bottom surfaces of the second substrate layers 262 and 283. When a pressure is applied to the touch input device 1000, the display panel 200A is bent. Due to the bending of the display panel 200A, the distance between the reference potential layer and the pressure sensor 450 and 460 may be changed. Also, the spacer layer may be disposed between the reference potential layer and the pressure sensor 450 and 460. In the case of the touch input device 1000 shown in FIGS. 3a and 3b, the spacer layer may be disposed on or inside the display panel 200A.

According to the embodiment, when the spacer layer is disposed inside the display module 200, the spacer layer may be the air gap which is included during the manufacture of the display panel 200A and/or the backlight unit. When the display panel 200A and/or the backlight unit includes one air gap, the one air gap may function as the spacer layer. When the display panel 200A and/or the backlight unit includes a plurality of the air gaps, the plurality of air gaps may collectively function as the spacer layer.

FIG. 4c is a perspective view of the touch input device 1000 according to the embodiment shown in FIG. 4a. As shown in FIG. 4c, the sensor sheet 440 of the embodiment may be disposed between the display module 200 and the substrate 300 in the touch input device 1000. Here, the touch input device 1000 may include the spacer layer disposed between the display module 200 and the substrate 300 in order to dispose the sensor sheet 440.

Hereafter, for the purpose of clearly distinguishing the electrodes 450 and 460 from the electrode included in the touch sensor 10, the sensors 450 and 460 for detecting the pressure are designated as pressure sensors 450 and 460. Here, since the pressure sensors 450 and 460 are disposed in the rear side instead of in the front side of the display panel 200A, the pressure sensor 450 and 460 may be made of an opaque material as well as a transparent material. When the display panel 200A is the LCD panel, the light from the backlight unit must transmit through the pressure sensors 450 and 460. Therefore, the pressure sensors 450 and 460 may be made of a transparent material such as ITO.

Here, a frame 330 having a predetermined height may be formed along the border of the upper portion of the substrate 300 in order to maintain the spacer layer 420 in which the pressure sensor 450 and 460 are disposed. Here, the frame 330 may be bonded to the cover layer 100 by means of an adhesive tape (not shown). While FIG. 4c shows the frame 330 is formed on the entire border (e.g., four sides of the quadrangle) of the substrate 300, the frame 330 may be formed only on at least some (e.g., three sides of the quadrangle) of the border of the substrate 300. According to the embodiment, the frame 330 may be formed on the top surface of the substrate 300 may be integrally formed with the substrate 300 on the top surface of the substrate 300. In the embodiment of the present invention, the frame 330 may be made of an inelastic material. In the embodiment of the present invention, when a pressure is applied to the display panel 200A through the cover layer 100, the display panel 200A, together with the cover layer 100, may be bent. Therefore, the magnitude of the touch pressure can be detected even though the frame 330 is not deformed by the pressure.

Figure 4D:
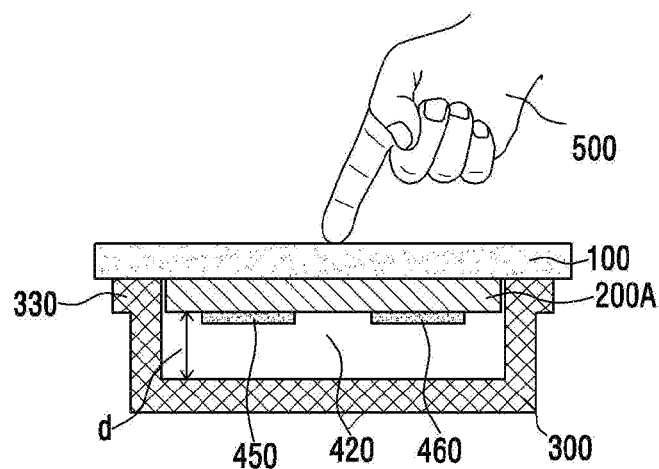

FIG. 4d is a cross sectional view of the touch input device including the pressure sensor according to the embodiment of the present invention. As shown in FIG. 4d, the pressure sensors 450 and 460 according to the embodiment of the present invention may be formed within the spacer layer 420 and on or in the bottom surface of the display panel 200A.

The pressure sensor for detecting the pressure may include the first sensor 450 and the second sensor 460. Here, any one of the first sensor 450 and the second sensor 460 may be a drive sensor, and the other may be a receiving sensor. A drive signal is applied to the drive sensor, and a sensing signal including information on electrical characteristics changing by applying the pressure may be obtained through the receiving sensor. For example, when a voltage is applied, a mutual capacitance may be generated between the first sensor 450 and the second sensor 460.

Figure 4E:
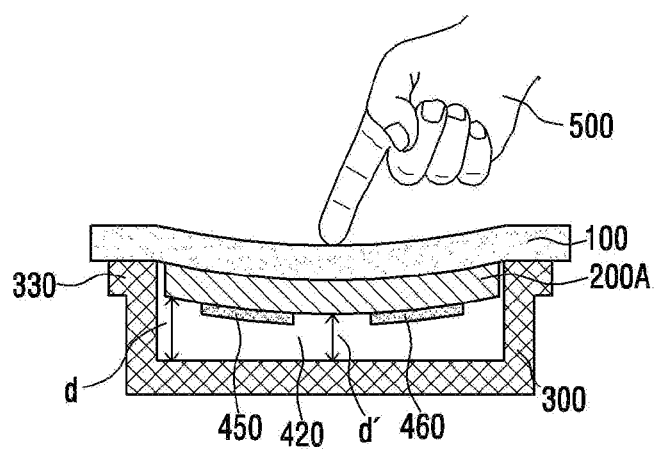

FIG. 4e is a cross sectional view when a pressure is applied to the touch input device 1000 shown in FIG. 4d. The top surface of the substrate 300 may have a ground potential so as to block the noise. When a pressure is applied to the surface of the cover layer 100 by an object 500, the cover layer 100 and the display panel 200A may be bent or pressed. As a result, a distance "d" between the ground potential surface and the pressure sensors 450 and 460 may be decreased to "d'". In this case, due to the decrease of the distance "d", the fringing capacitance is absorbed in the top surface of the substrate 300, so that the mutual capacitance between the first sensor 450 and the second sensor 460 may be reduced. Therefore, the magnitude of the touch pressure can be calculated by obtaining the reduction amount of the mutual capacitance from the sensing signal obtained through the receiving sensor.

Although it has been described in FIG. 4e that the top surface of the substrate 300 has the ground potential, that is to say, is the reference potential layer, the reference potential layer may be disposed inside the display module 200. Here, when a pressure is applied to the surface of the cover layer 100 by the object 500, the cover layer 100 and the display panel 200A may be bent or pressed. As a result, a distance between the pressure sensors 450 and 460 and the reference potential layer disposed inside the display module 200 is changed. Therefore, the magnitude of the touch pressure can be calculated by obtaining the capacitance change amount from the sensing signal obtained through the receiving sensor.

In the touch input device 1000 according to the embodiment of the present invention, the display panel 200A may be bent or pressed by the touch applying the pressure. When the display panel 200A is bent or pressed according to the embodiment, a position showing the biggest deformation may not match the touch position. However, the display panel 200A may be shown to be bent at least at the touch position. For example, when the touch position approaches close to the border, edge, etc., of the display panel 200A, the most bent or pressed position of the display panel 200A may not match the touch position, however, the display panel 200A may be shown to be bent or pressed at least at the touch position.

In the state where the first sensor 450 and the second sensor 460 are formed in the same layer, each of the first sensor 450 and the second sensor 460 shown in FIGS. 4*d* and 4*e* may be, as shown in FIG. 7*a*, composed of a plurality of lozenge-shaped sensors. Here, the plurality of the first sensors 450 are connected to each other in the first axial direction, and the plurality of the second sensors 460 are connected to each other in the second axial direction orthogonal to the first axial direction. The lozenge-shaped sensors of at least one of the first sensor 450 and the second sensor 460 are connected to each other through a bridge, so that the first sensor 450 and the second sensor 460 may be insulated from each other. Also, here, the pressure sensor shown in FIGS. 6*a* to 6*c* may be composed of a sensor having a form shown in FIG. 7*b*.

In the foregoing, it is shown that the touch pressure is detected from the change of the mutual capacitance between the first sensor 450 and the second sensor 460. However, the pressure sensing unit may be configured to include only any one of the first sensor 450 and the second sensor 460. In this case, it is possible to detect the magnitude of the touch pressure by detecting the change of the capacitance between the one pressure sensor and a ground layer (the reference potential layer disposed inside the display module 200 or the substrate 300), that is to say, the change of the self-capacitance. Here, the drive signal is applied to the one pressure sensor, and the change of the self-capacitance between the pressure sensor and the ground layer can be detected by the pressure sensor.

For instance, in FIG. 4*d*, the pressure sensor may be configured to include only the first sensor 450. Here, the magnitude of the touch pressure can be detected by the change of the capacitance between the first sensor 450 and the substrate 300, which is caused by a distance change between the substrate 300 and the first sensor 450. Since the distance "d" is reduced with the increase of the touch pressure, the capacitance between the substrate 300 and the first sensor 450 may be increased with the increase of the touch pressure. Here, the pressure sensor should not necessary have a comb teeth shape or a trident shape, which is required to improve the detection accuracy of the mutual capacitance change amount. The pressure sensor may have a plate shape (e.g., quadrangular plate). Or, as shown in FIG. 7*d*, the plurality of the first sensors 450 may be disposed at a regular interval in the form of a grid.

Figure 4F:
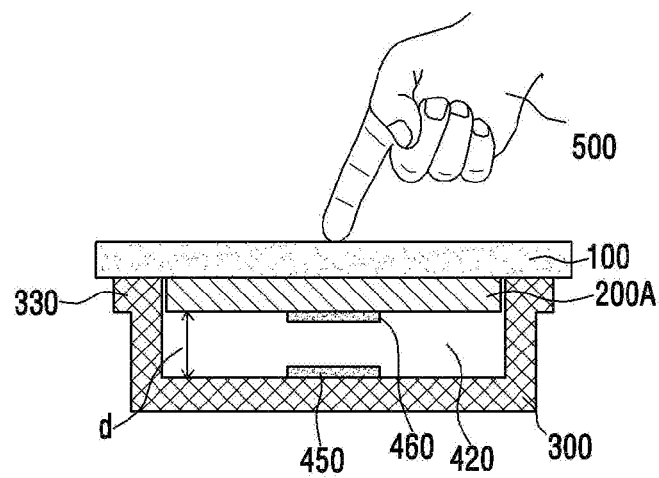
Figure 4G:
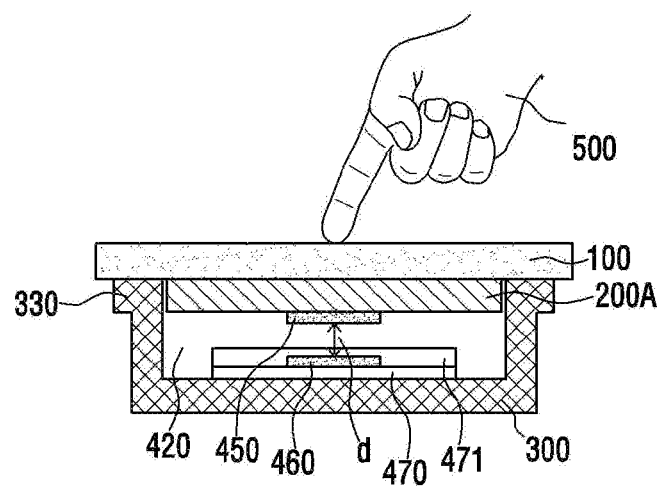

FIG. 4*f* shows that the pressure sensors 450 and 460 are formed within the spacer layer 420 and on the top surface of the substrate 300 and on the bottom surface of the display module 200. Here, when the pressure sensing unit is, as shown in FIG. 4*a*, comprised of the sensor sheet, the sensor sheet is composed of a first sensor sheet 440-1 including the first sensor 450 and a second sensor sheet 440-2 including the second sensor 460. Here, one of the first sensor 450 and the second sensor 460 may be formed on the substrate 300 and the other may be formed on the bottom surface of the display module 200. FIG. 4*g* shows that the first sensor 450 is formed on the substrate 300 and the second sensor 460 is formed on the bottom surface of the display module 200.

FIG. 4*g* shows that the pressure sensors 450 and 460 are formed within the spacer layer 420 and on the top surface of the substrate 300 and on the bottom surface of the display panel 200A. Here, the first sensor 450 may be formed on the bottom surface of the display panel 200A, and the second sensor 460 may be disposed on the top surface of the substrate 300 in the form of a sensor sheet in which the second sensor 460 is formed on a first insulation layer 470 and a second insulation layer 471 is formed on the second sensor 460.

When the object 500 applies a pressure to the surface of the cover layer 100, the cover layer 100 and the display panel 200A may be bent or pressed. As a result, a distance "d" between the first sensor 450 and the second sensor 460 may be reduced. In this case, the mutual capacitance between the first sensor 450 and the second sensor 460 may be increased with the reduction of the distance "d". Therefore, the magnitude of the touch pressure can be calculated by obtaining the increase amount of the mutual capacitance from the sensing signal obtained through the receiving sensor. Here, in FIG. 4*g*, since the first sensor 450 and the second sensor 460 are formed in different layers, the first sensor 450 and the second sensor 460 should not necessary have a comb teeth shape or a trident shape. Any one sensor of the first sensor 450 and the second sensor 460 may have a plate shape (e.g., quadrangular plate), and the other remaining plural sensors may be, as shown in FIG. 7*d*, disposed at a regular interval in the form of a grid.

While the foregoing has described that the pressure sensors 450 and 460 are, as shown in FIG. 4*b*, directly formed on the bottom surface of the display panel 200A, the embodiment in which the sensor sheet 440 including the pressure sensors 450 and 460 is, as shown in FIG. 4*a*, disposed between the display module 200 and the substrate 300 can be also applied. Specifically, the sensor sheet 440 including the pressure sensors 450 and 460 may be attached to the bottom surface of the display module 200 or may be attached to the top surface of the substrate 300.

Figure 5:
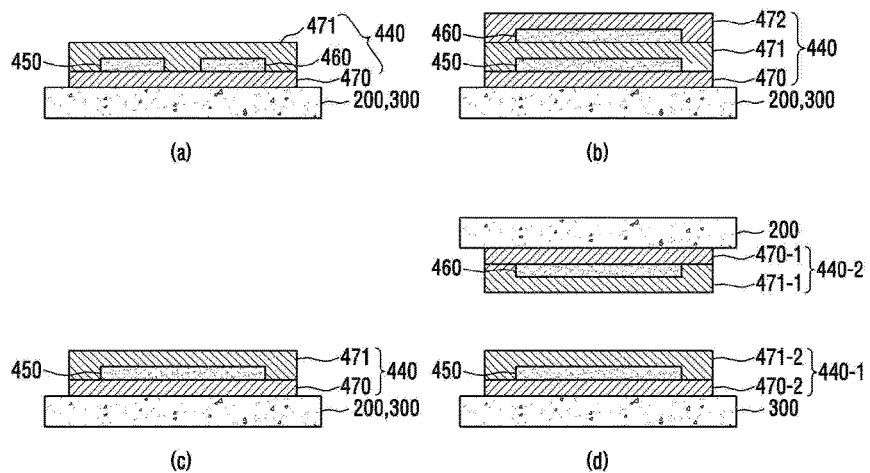
FIG. 5 shows a cross section of a sensor sheet according to the embodiment of the present invention.

In this case, the top surface of the substrate 300 may have the ground potential for shielding the noise. FIG. 5 shows a cross section of the sensor sheet according to the embodiment of the present invention. Referring to (a) of FIG. 5, the cross sectional view shows that the sensor sheet 440 including the pressure sensors 450 and 460 has been attached to the substrate 300 or the display module 200. Here, a short-circuit can be prevented from occurring between the pressure electrodes 450 and 460 and either the substrate 300 or the display module 200 because the pressure sensors 450 and 460 are disposed between the first insulation layer 470 and the second insulation layer 471 in the sensor sheet 440. Depending on the type and/or implementation method of the touch input device 1000, the substrate 300 or the display module 200 to which the pressure sensors 450 and 460 are attached may not have the ground potential or may have a weak ground potential. In this case, the touch input device 1000 according to the embodiment of the present invention may further include a ground electrode (not shown) between the insulation layer 470 and either the substrate 300 or the display module 200. According to the embodiment of the present invention, the touch input device 1000 invention may further include another insulation layer (not shown) between the ground electrode and either the substrate 300 or the display module 200. Here, the ground electrode (not shown) is able to prevent the size of the capacitance generated between the first sensor 450 and the second sensor 460, which are pressure sensors, from increasing excessively.

It is possible to consider that the first sensor 450 and the second sensor 460 are formed in different layers in accordance with the embodiment of the present invention so that a sensor layer is formed. In (b) of FIG. 5, the cross sectional view shows that the first sensor 450 and the second sensor 460 are formed in different layers. As shown in (b) of FIG. 5, the first sensor 450 may be formed on the first insulation layer 470, and the second sensor 460 may be formed on the second insulation layer 471 located on the first sensor 450. According to the embodiment of the present invention, the second sensor 460 may be covered with a third insulation layer 472. In other words, the sensor sheet 440 may include the first to third insulation layers 470 to 472, the first sensor 450, and the second sensor 460. Here, the first sensor 450 and the second sensor 460 may be implemented so as to overlap each other because they are disposed in different layers. For example, the first sensor 450 and the second sensor 460 may be, as shown in FIG. 7c, formed similarly to the pattern of the drive electrode TX and receiving electrode RX which are arranged in the form of M×N array. Here, M and N may be natural numbers greater than 1. Also, as shown in FIG. 7a, the lozenge-shaped first sensor 450 and the lozenge-shaped second sensor 460 may be located in different layers respectively.

In (c) of FIG. 5, the cross sectional view shows that the sensor sheet 440 is implemented to include only the first sensor 450. As shown in (c) of FIG. 5, the sensor sheet 440 including the first sensor 450 may be disposed on the substrate 300 or the display module 200.

In (d) of FIG. 5, the cross sectional view shows that the first sensor sheet 440-1 including the first sensor 450 is attached to the substrate 300, and the second sensor sheet 440-2 including the second sensor 460 is attached to the display module 200. As shown in (d) of FIG. 5, the first sensor sheet 440-1 including the first sensor 450 may be disposed on the substrate 300. Also, the second sensor sheet 440-2 including the second sensor 460 may be disposed on the bottom surface of the display module 200.

As with the description related to (a) of FIG. 5, when the substrate 300 or the display module 200 to which the pressure sensors 450 and 460 are attached may not have the ground potential or may have a weak ground potential, the sensor sheet 440 in (a) to (d) of FIG. 5 may further include a ground electrode (not shown) between the first insulation layers 470, 470-1, and 470-2 and either the substrate 300 or the display module 200. Here, the sensor sheet 440 may further include an additional insulation layer (not shown) between the ground electrode (not shown) and either the substrate 300 or the display module 200.

Figure 6A:
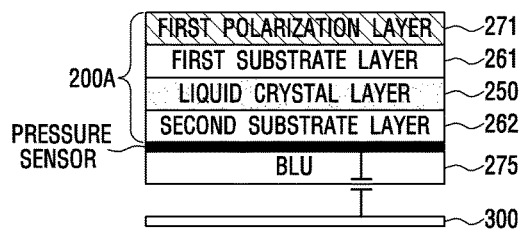
FIGS. 6a to 6c are cross sectional views showing embodiments of pressure sensors formed directly on various display panels of the touch input device according to the embodiment of the present invention.
Figure 6B:
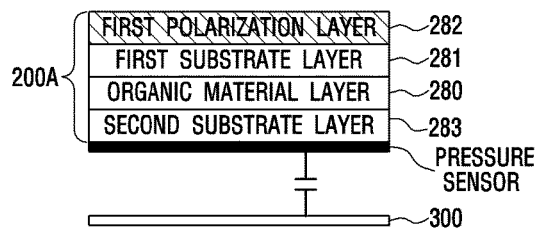
Figure 6C:
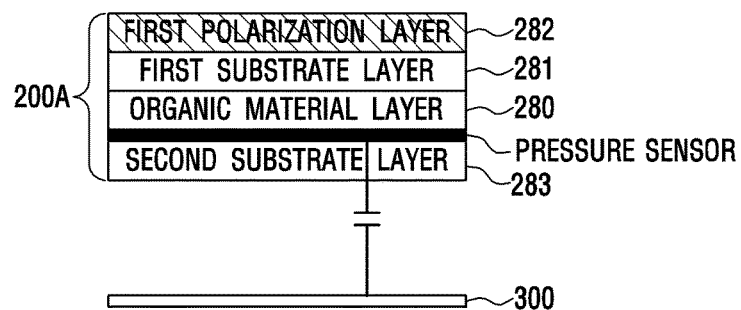

In the touch input device 1000 according to the embodiment of the present invention, the pressure sensors 450 and 460 may be directly formed on the display panel 200A. FIGS. 6a to 6c are cross sectional views showing an embodiment of the pressure sensor formed directly on various display panel of the touch input device according to the embodiment of the present invention.

First, FIG. 6a shows the pressure sensors 450 and 460 formed on the display panel 200A using the LCD panel. Specifically, as shown in FIG. 6a, the pressure sensors 450 and 460 may be formed on the bottom surface of the second substrate layer 262. Here, the pressure sensors 450 and 460 may be formed on the bottom surface of the second polarization layer 272. In detecting the touch pressure on the basis of the mutual capacitance change amount when a pressure is applied to the touch input device 1000, a drive signal is applied to the drive sensor 450, and an electrical signal including information on the capacitance which is changed by the distance change between the pressure sensors 450 and 460 and the reference potential layer separated from the pressure sensors 450 and 460 is received from the receiving sensor 460. When the touch pressure is detected on the basis of the self-capacitance change amount, a drive signal is applied to the pressure sensors 450 and 460, and an electrical signal including information on the capacitance which is changed by the distance change between the pressure sensors 450 and 460 and the reference potential layer separated from the pressure sensors 450 and 460 is received from the pressure sensors 450 and 460. Here, the reference potential layer may be the substrate 300 or may be the cover which is disposed between the display panel 200A and the substrate 300 and performs a function of protecting the display panel 200A.

Next, FIG. 6b shows the pressure sensors 450 and 460 formed on the bottom surface of the display panel 200A using the OLED panel (in particular, AM-OLED panel). Specifically, the pressure sensors 450 and 460 may be formed on the bottom surface of the second substrate layer 283. Here, a method for detecting the pressure is the same as that described in FIG. 6a.

In the case of the OLED panel, since the organic material layer 280 emits light, the pressure sensors 450 and 460 which are formed on the bottom surface of the second substrate layer 283 disposed under the organic material layer 280 may be made of an opaque material. However, in this case, a pattern of the pressure sensors 450 and 460 formed on the bottom surface of the display panel 200A may be shown to the user. Therefore, for the purpose of directly forming the pressure sensors 450 and 460 on the bottom surface of the second substrate layer 283, a light shielding layer like black ink is applied on the bottom surface of the second substrate layer 283, and then the pressure sensors 450 and 460 may be formed on the light shielding layer.

Also, FIG. 6b shows that the pressure sensors 450 and 460 are formed on the bottom surface of the second substrate layer 283. However, a third substrate layer (not shown) may be disposed under the second substrate layer 283, and the pressure sensors 450 and 460 may be formed on the bottom surface of the third substrate layer. In particular, when the display panel 200A is a flexible OLED panel, the third substrate layer which is not relatively easily bent may be disposed under the second substrate layer 283 because the display panel 200A composed of the first substrate layer 281, the organic material layer 280, and the second substrate layer 283 is very thin and easily bent.

Next, FIG. 6c shows the pressure sensors 450 and 460 formed inside the display panel 200A using the OLED panel. Specifically, the pressure sensors 450 and 460 may be formed on the top surface of the second substrate layer 283. Here, a method for detecting the pressure is the same as that described in FIG. 6a.

Also, although the display panel 200A using the OLED panel has been described by taking an example thereof with reference to FIG. 6c, it is possible that the pressure sensors 450 and 460 are formed on the top surface of the second substrate layer 262 of the display panel 200A using the LCD panel.

Also, although it has been described in FIGS. 6a to 6c that the pressure sensors 450 and 460 are formed on the top surfaces or bottom surfaces of the second substrate layers 262 and 283, it is possible that the pressure sensors 450 and 460 are formed on the top surfaces or bottom surfaces of the first substrate layers 261 and 281.

Also, it has been described in FIGS. 6a to 6c that the pressure sensing unit including the pressure sensors 450 and 460 is directly formed on the display panel 200A. However, the pressure sensing unit may be directly formed on the substrate 300, and the potential layer may be the display panel 200A or may be the cover which is disposed between the display panel 200A and the substrate 300 and performs a function of protecting the display panel 200A.

Also, although it has been described in FIGS. 6a to 6c that the reference potential layer is disposed under the pressure sensing unit, the reference potential layer may be disposed within the display panel 200A. Specifically, the reference potential layer may be disposed on the top surface or bottom surface of the first substrate layers 261 and 281 of the display panel 200A or may be disposed on the top surface or bottom surface of the second substrate layers 262 and 283.

In the touch input device 1000 according to the embodiment of the present invention, the pressure sensors 450 and 460 for sensing the capacitance change amount may be, as described in FIG. 4g, composed of the first sensor 450 which is directly formed on the display panel 200A and the second sensor 460 which is configured in the form of a sensor sheet. Specifically, the first sensor 450 may be, as described in FIGS. 6a to 6c, directly formed on the display panel 200A, and second sensor 460 may be, as described in FIG. 4g, configured in the form of a sensor sheet and may be attached to the touch input device 1000.

In the touch input device 1000 according to the embodiment of the present invention, when the pressure sensor controller 1300 and the touch sensor controller 1100 are integrated into one IC and driven, a controller of the IC may perform the scanning of the touch sensor 10 and simultaneously perform the scanning of the pressure sensing unit, or the controller of the IC may perform the time-sharing, and then may generate a control signal such that the scanning of the touch sensor 10 is performed in a first time interval and the scanning of the pressure sensing unit is performed in a second time interval different from the first time interval.

In the foregoing, it has been described that the pressure sensors 450 and 460 included in the pressure sensing unit are composed of the electrodes and as the electrical characteristic sensed by the pressure sensing unit, the capacitance change amount due to the bending of the display panel 200A is detected, so that the magnitude of the pressure is detected. However, there is no limitation to this. The pressure sensor 450 included in the pressure sensing unit are composed of the strain gauge and as the electrical characteristic sensed by the pressure sensing unit, the change amount of a resistance value of the pressure sensor 450 which is changed by the bending of the display panel 200A is detected, so that the magnitude of the pressure is detected.

The touch input device to be described below according to the embodiment of the present invention includes a pressure sensing circuit.

Figure 8:
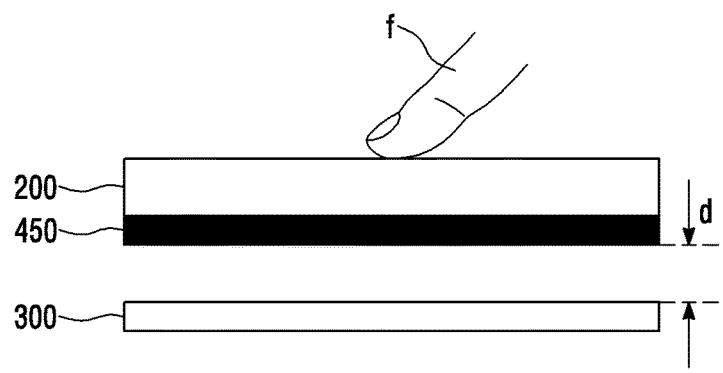
FIG. 8 shows a cross section of the touch input device to which a pressure sensing circuit has been applied in accordance with the embodiment of the present invention.

FIG. 8 shows a cross section of the touch input device to which the pressure sensing circuit has been applied in accordance with the embodiment of the present invention. The touch input device shown in FIG. 8 includes the display module 200, the substrate 300, and the pressure sensor 450.

The substrate 300 is disposed under the display module 200. The substrate 300 includes the reference potential layer for the pressure sensor 450. The substrate 300 itself may be the reference potential layer, or alternatively the substrate 300 may include a separate reference potential layer. The reference potential layer may be a ground layer having a ground potential.

The pressure sensor 450 is disposed between the display module 200 and the substrate 300. The pressure sensor 450 is disposed on the bottom surface of the display module 200. Here, the pressure sensor 450 may be, as shown in FIG. 4b, directly formed on the bottom surface of the display module 200, or alternatively the sensor sheet 440 including the pressure sensor 450 may be, as shown in FIG. 4a, attached to the bottom surface of the display module 200. Also, the pressure sensor 450 may be, as shown in FIGS. 6a to 6c, disposed on the display panel 200A of the display module 200.

The capacitance between the pressure sensor 450 and the substrate 300 is changed according to the change of the distance "d" between the pressure sensor 450 and the substrate 300. Here, the pressure sensing circuit according to the embodiment of the present invention senses such a capacitance change, so that the touch input device including the pressure sensing circuit according to the embodiment of the present invention is able to detect the magnitude of the input pressure of an object "f".

The touch input device according to the embodiment of the present invention is able to detect the pressure magnitude on the basis of the self-capacitance of the pressure sensor 450. When the object "f" presses the touch surface of the touch input device, the distance "d" between the pressure sensor 450 and the reference potential layer is decreased in accordance with the magnitude of the pressure. As the distance "d" becomes smaller, the capacitance of the capacitor, which is formed between the pressure sensor 450 and the reference potential layer may be increased. That is, as the distance "d" becomes smaller, the self-capacitance of the pressure sensor 450 with respect to the reference potential layer may be increased.

Figure 9:
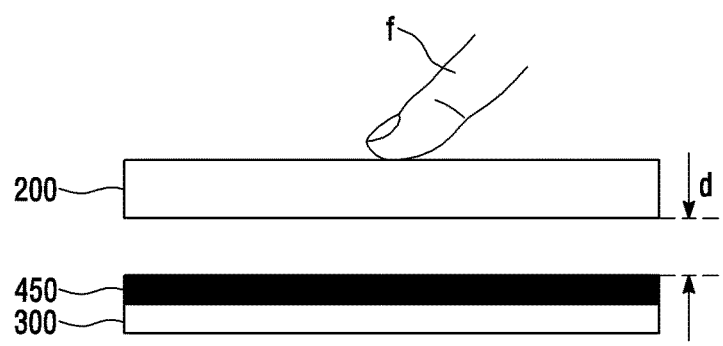
FIG. 9 shows a cross section of the touch input device to which the pressure sensing circuit has been applied in accordance with the embodiment of the present invention.

FIG. 9 shows a cross section of the touch input device to which the pressure sensing circuit has been applied in accordance with the embodiment of the present invention. The touch input device shown in FIG. 9 includes the display module 200, the substrate 300, and the pressure sensor 450.

The substrate 300 is disposed under the display module 200.

The display module 200 is disposed on the substrate 300. The display module 200 includes the reference potential layer with respect to the pressure sensor 450. The reference potential layer may be a ground layer having a ground potential.

The pressure sensor 450 is disposed between the display module 200 and the substrate 300. The pressure sensor 450 is disposed on the substrate 300. Here, the pressure sensor 450 may be directly formed on the top surface of the substrate 300, or alternatively the sensor sheet 440 including the pressure sensor 450 may be attached to the top surface of the substrate 300.

The capacitance between the pressure sensor 450 and the reference potential layer changes according to the change of the distance "d" between the pressure sensor 450 and the reference potential layer included in the display module 200. The pressure sensing circuit according to the embodiment of the present invention senses such a capacitance change, so that the touch input device including the pressure sensing circuit according to the embodiment of the present invention is able to detect the magnitude of the input pressure of the object "f".

The touch input device according to the embodiment of the present invention is able to detect the pressure magnitude on the basis of the self-capacitance of the pressure sensor 450. When the object "f" presses the touch surface of the touch input device, the distance "d" between the pressure sensor 450 and the reference potential layer is decreased in accordance with the magnitude of the pressure. As the distance "d" becomes smaller, the capacitance of the capacitor, which is formed between the pressure sensor 450 and the reference potential layer may be increased. That is, as the distance "d" becomes smaller, the self-capacitance of the pressure sensor 450 with respect to the reference potential layer may be increased.

The pressure sensing circuit which senses the magnitude of the input pressure on the basis of the capacitance change amount sensed by the pressure sensor 450 of the touch input device shown in FIGS. 8 to 9 will be described with reference to FIGS. 10 to 22.

An output signal $V_o$ of the pressure sensing circuit according to the embodiment which is described below has a unique characteristic of being proportional to the distance "d" between the pressure sensor 450 and the reference potential layer shown in FIGS. 8 to 9. Due to the unique characteristic, a pressure sensing sensitivity can achieve a certain technical effect. Particularly, even when the distance "d" between the pressure sensor 450 and the reference potential layer is not uniform according to the manufacturing process, the pressure sensing sensitivity is constant. Also, even in a special case where the substrate 300 is bent by an external force, the pressure sensing sensitivity is also constant.

Figure 10:
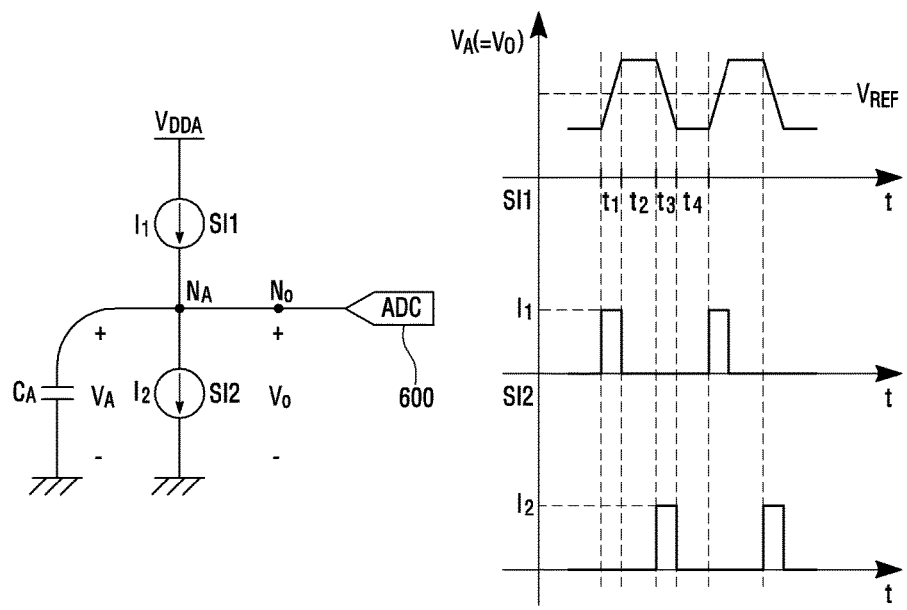
FIG. 10 shows the pressure sensing circuit according to a first embodiment of the present invention.

FIG. 10 shows the pressure sensing circuit according to a first embodiment of the present invention.

Referring to FIG. 10, the pressure sensing circuit according to the first embodiment includes a first current source SI1 and a second current source SI2 which are connected in series between a power voltage $V_{DDA}$ and a ground voltage, a pressure sensing node $N_A$ connected between the first current source SI1 and the second current source SI2, and an output node $N_o$ which is connected to the pressure sensing node $N_A$ and outputs the output signal $V_o$.

Here, the pressure sensing node $N_A$ is connected to a pressure capacitor $C_A$ corresponding to the capacitance of the pressure sensor 450 shown in FIG. 8 or 9. Here, the pressure capacitor $C_A$ is connected between the pressure sensing node $N_A$ and the ground voltage.

The first current source SI1 is turned on during a first predetermined time period t1 every cycle and turned off during the other time periods. The second current source SI2 is turned on during a third predetermined time period t3 every cycle and turned off during the other time periods. Here, the first time period t1 and the third time period t3 may be the same as each other. Also, a first current I1 from the first current source SI1 and a second current I2 from the second current source SI2 may have the same magnitude.

The third time period t3 is after the first time period t1, and the first current source SI1 and the second current source SI2 are turned off during a second time period t2 between the first time period t1 and the third time period t3. The first current source SI1 and the second current source SI2 are turned off during a fourth time period t4 after the third time period t3. Here, the second time period t2 and the fourth time period t4 may be the same as each other.

Here, the sum of the first time period t1 to the fourth time period t4 may match the cycle of the first current source SI1 and the cycle of the second current source SI2.

The operation of the pressure sensing circuit shown in FIG. 10 according to the embodiment of the present invention will be described. During the first time period t1, the first current source SI1 is turned on and the second current source SI2 is turned off, so that electric charges are charged in the pressure capacitor $C_A$, and thus, a voltage $V_A$ of the pressure sensing node $N_A$ increases. During the third time period t3, the first current source SI1 is turned off and the second current source SI2 is turned on, so that electric charges charged in the pressure capacitor $C_A$ are discharged, and thus, the voltage $V_A$ of the pressure sensing node $N_A$ decreases. During the second time period t2 and the fourth time period t4, the first current source SI1 and second current source SI2 are turned off, so that the voltage $V_A$ of the pressure sensing node $N_A$ becomes a both-end voltage of the pressure capacitor $C_A$. Since the output node $N_o$ has the same electric potential difference as that of the pressure sensing node $N_A$, the output signal $V_o$ of the output node $N_o$ becomes the voltage $V_A$ of the pressure sensing node $N_A$.

The output signal $V_o$ of the pressure sensing circuit shown in FIG. 10 according to the embodiment of the present invention has a characteristic of being proportional to the distance "d" shown in FIG. 8 or 9 between the pressure sensor 450 and the reference potential layer. Such a characteristic is proved by the following equations.

$$V_A = \frac{Q}{C_A} \qquad \text{Equation (1)}$$

In equation (1), $V_A$ represents a voltage of the pressure sensor 450 as the voltage of the pressure sensing node $N_A$. $C_A$ represents a capacitance of the pressure sensor 450. Q represents the amount of charge which is charged in or discharged from the $C_A$.

$$C_A = \frac{\varepsilon A}{d}, Q = I \times t \qquad \text{Equation (2)}$$

In equation (2), "A" represents the area of the pressure sensor 450. "d" represents the distance between the pressure sensor 450 and the reference potential layer. "I" represents a current which is applied as a driving current to the pressure sensor 450. "t" represents a driving time of the pressure sensor 450.

The following equation (3) is obtained by substituting the equation (2) into the equation (1).

$$V_A = \frac{It}{\frac{\varepsilon A}{d}} = \frac{It}{\varepsilon A} d \qquad \text{Equation (3)}$$

Through the equation (3), a proportional relationship of the following equation (4) can be obtained.

$$V_A \propto d \qquad \text{Equation (4)}$$

In the pressure sensing circuit shown in FIG. 10, $V_A$ is equal to $V_o$. Therefore, as shown in the following equation (5), it can be seen that the output signal $V_o$ of the pressure sensing circuit shown in FIG. 10 according to the embodiment of the present invention is proportional to the distance "d" shown in FIG. 8 or 9 between the pressure sensor 450 and the reference potential layer.

$$V_o \propto d \qquad \text{Equation (5)}$$

Meanwhile, the pressure sensing circuit shown in FIG. 10 according to the embodiment of the present invention may further include an analog-digital converter (ADC) converter 600 connected to the output node $N_o$. The ADC 600 converts the output signal $V_o$ output from the output node $N_o$ into a digital signal. The converted digital signal may be input to a processor such as AP, CPU or the like, and be processed to obtain the magnitude of the pressure.

Figure 11:
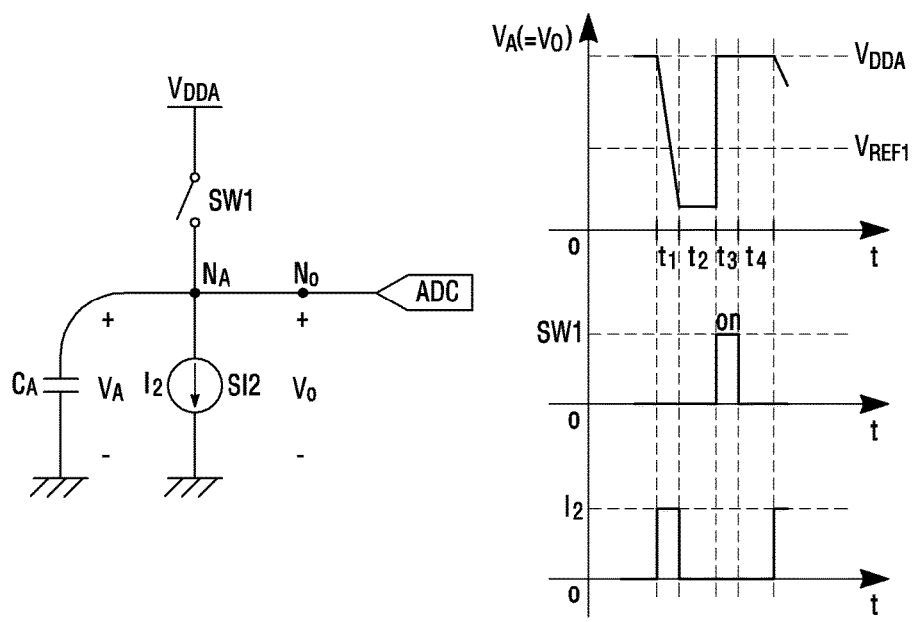
FIG. 11 shows a first modified example of the pressure sensing circuit according to the first embodiment of the present invention shown in FIG. 10.

FIG. 11 shows a first modified example of the pressure sensing circuit according to the first embodiment of the present invention shown in FIG. 10.

The first modified example shown in FIG. 11 is obtained by replacing the first current source SI1 of the pressure sensing circuit according to the first embodiment shown in FIG. 10 with a first switch SW1. The remaining circuit components except for the first switch SW1 are the same as those of FIG. 10.

The first switch SW1 is turned on during the third predetermined time period t3 every cycle and turned off during the other time periods. The second current source SI2 is turned on during the first predetermined time period t1 every cycle and turned off during the other time periods.

Here, the third time period t3 during which the first switch SW1 is turned on does not overlap with the first time period t1 during which the second current source SI2 is turned on. For this, the second time period t2 exists between the first time period t1 and the third time period t3, and the fourth time period t4 exists between the third time period t3 and the first time period t1 of the next cycle. The length of the first time period t1 may be equal to or not equal to the length of the third time period t3. Also, the length of the fourth time period t4 may be equal to or not equal to that of one of the first to third time periods t1 to t3, or may be considerably small.

Describing the operation of the pressure sensing circuit of the first modified example shown in FIG. 11, since the second current source SI2 is turned on and the first switch SW1 is turned off during the first time period t1, the electric charges charged in the pressure capacitor $C_A$ is discharged. As the charged electric charges are discharged, the voltage $V_A$ of the pressure sensing node $N_A$ decreases.

Since the second current source SI2 is turned off and the first switch SW1 is turned off during the second time period t2, the predetermined voltage $V_A$ is maintained to the pressure sensing node $N_A$. The predetermined voltage $V_A$ has a predetermined magnitude according to the pressure capacitor $C_A$, the magnitude $I_2$ of the constant current of the second current source SI2, and the length of the first time period t1. Here, the second time period t2 may be a time period for measuring the predetermined voltage $V_A$.

The first switch SW1 is turned on and the second current source SI2 is turned off during the third time period t3. Therefore, at the moment when the first switch SW1 is turned on, the electric charges are charged in the pressure capacitor $C_A$ by the power voltage $V_{DDA}$ and the voltage $V_A$ of the pressure sensing node $N_A$ becomes the power voltage $V_{DDA}$.

Since the first switch SW1 is turned off and the second current source SI2 is turned off during the fourth time period t4, the voltage $V_A$ of the pressure sensing node $N_A$ is maintained as it is.

As with the pressure sensing circuit shown in FIG. 10, the output signal $V_o$ of the pressure sensing circuit of the first modified example shown in FIG. 11 is proportional to the distance "d" between the pressure sensor 450 and the reference potential layer shown in FIG. 8 or 9. This characteristic is proved by the above-described equations (1) to (5).

Figure 12:
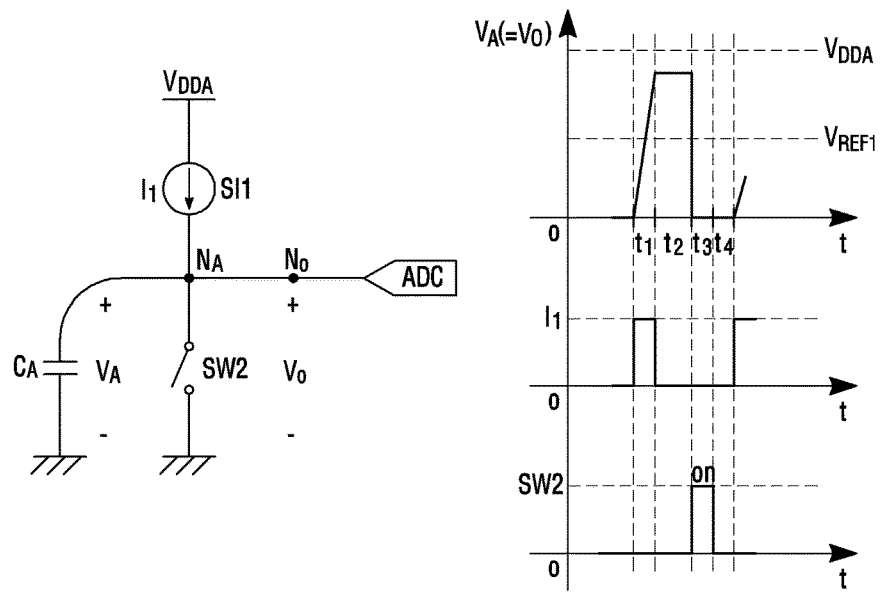
FIG. 12 shows a second modified example of the pressure sensing circuit according to the first embodiment of the present invention shown in FIG. 10.

FIG. 12 shows a second modified example of the pressure sensing circuit according to the first embodiment of the present invention shown in FIG. 10.

The second modified example shown in FIG. 12 is obtained by replacing the second current source SI2 of the pressure sensing circuit of the first embodiment shown in FIG. 10 with a second switch SW2. The remaining circuit components except for the first switch SW1 are the same as those of FIG. 10.

The second switch SW2 is turned on during the third predetermined time period t3 every cycle and turned off during the other time periods. The first current source SI1 is turned on during the first predetermined time period t1 every cycle and turned off during the other time periods.

Here, the third time period t3 during which the second switch SW2 is turned on does not overlap with the first time period t1 during which the first current source SI1 is turned on. For this, the second time period t2 exists between the first time period t1 and the third time period t3, and the fourth time period t4 exists between the third time period t3 and the first time period t1 of the next cycle. The length of the first time period t1 may be equal to or not equal to the length of the third time period t3. Also, the length of the fourth time period t4 may be equal to or not equal to that of one of the first to third time periods t1 to t3, or may be considerably small.

Describing the operation of the pressure sensing circuit of the second modified example shown in FIG. 12, since the first current source SI1 is turned on and the second switch SW2 is turned off during the first time period t1, the electric charges are charged in the pressure capacitor $C_A$. As the electric charges are charged, the voltage $V_A$ of the pressure sensing node $N_A$ increases.

Since the first current source SI1 is turned off and the second switch SW2 is turned off during the second time period t2, the predetermined voltage $V_A$ is maintained to the pressure sensing node $N_A$. The predetermined voltage $V_A$ has a predetermined magnitude according to the pressure capacitor $C_A$, the magnitude $I_1$ of the constant current of the first current source SI1, and the length of the first time period t1. Here, the second time period t2 may be a time period for measuring the predetermined voltage $V_A$.

The second switch SW2 is turned on and the first current source SI1 is turned off during the third time period t3. Therefore, at the moment when the second switch SW2 is turned on, all of the electric charges charged in the pressure capacitor $C_A$ are discharged and the voltage $V_A$ of the pressure sensing node $N_A$ becomes 0.

Since the second switch SW2 is turned off and the first current source SI1 is turned off during the fourth time period t4, the voltage $V_A$ of the pressure sensing node $N_A$ is maintained as it is.

As with the pressure sensing circuit shown in FIG. 10, the output signal $V_o$ of the pressure sensing circuit of the second modified example shown in FIG. 12 is proportional to the distance "d" between the pressure sensor 450 and the reference potential layer shown in FIG. 8 or 9. This characteristic is proved by the above-described equations (1) to (5).

Figure 13:
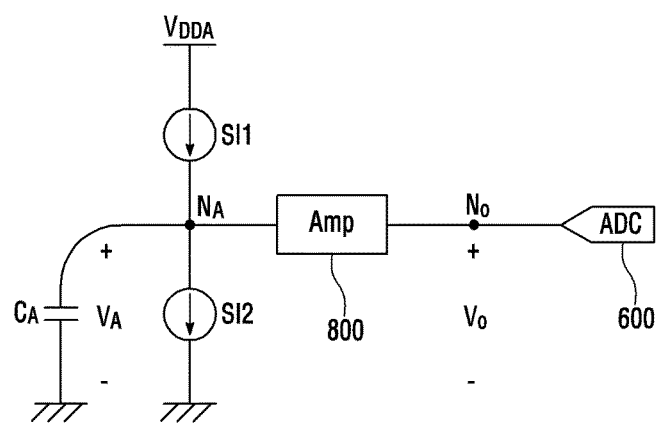
FIG. 13 shows the pressure sensing circuit according to a second embodiment of the present invention.

FIG. 13 shows the pressure sensing circuit according to a second embodiment of the present invention.

The pressure sensing circuit shown in FIG. 13 according to the second embodiment of the present invention is obtained by adding an amplifier 800 to the pressure sensing circuit shown in FIG. 10 according to the first embodiment of the present invention. Here, the amplifier 800 is connected between the pressure sensing node $N_A$ and the output node $N_o$.

The amplifier 800 amplifies the voltage VA of the pressure sensing node $N_A$ by a predetermined ratio and transmits to the output node $N_o$. Therefore, compared with the output signal of FIG. 10, the output signal $V_o$ output from the output node $N_o$ is amplified by the above ratio.

The pressure sensing circuit shown in FIG. 13 according to the second embodiment has the characteristics of the pressure sensing circuit shown in FIG. 10 as they are. Additionally, the pressure sensing circuit shown in FIG. 11 according to the second embodiment has the amplified output signal. Therefore, the pressure sensing sensitivity is further improved.

Meanwhile, the pressure sensing circuit according to the second embodiment of the present invention shown in FIG. 13 may be the pressure sensing circuit according to the first embodiment of the present invention shown in FIG. 10 or may be obtained by further adding an amplifier (Amp) 800 to the first modified example shown in FIG. 11 or to the second modified example shown in FIG. 12.

Figure 14:
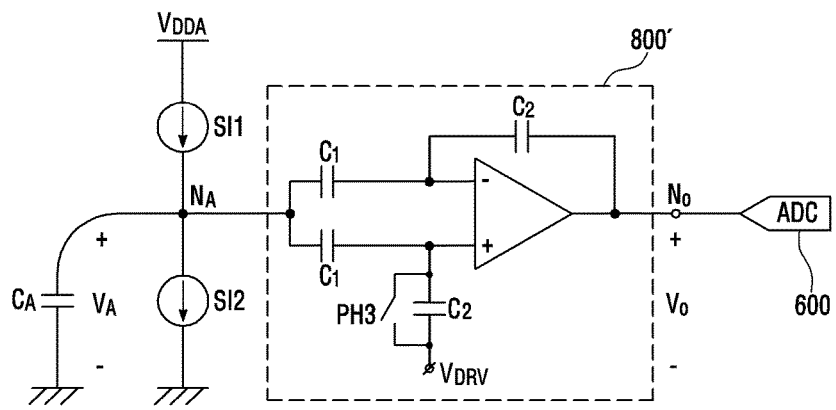
FIG. 14 shows the pressure sensing circuit according to a third embodiment of the present invention.

FIG. 14 shows the pressure sensing circuit according to a third embodiment of the present invention.

The pressure sensing circuit shown in FIG. 14 according to the third embodiment of the present invention is obtained by adding an amplifier 800' to the pressure sensing circuit shown in FIG. 10 according to the first embodiment of the present invention. Here, the amplifier 800' is a concrete example of the amplifier 800 shown in FIG. 13.

The amplifier 800' is connected between the pressure sensing node $N_A$ and the output node $N_o$.

The amplifier 800' operates as an inverting amplifier or a non-inverting amplifier during the first time period t1 and the third time period t3, and operates as a differential amplifier during the second time period t2 and the fourth time period t4. Since the amplifier 800' operates as an inverting amplifier or a non-inverting amplifier during the first time period t1 and the third time period t3, it is desirable that the first time period t1 and the third time period t3 should be maintained as small as possible in order that noise which is introduced through the pressure sensor 450 is minimized during the first time period t1 and the third time period t3.

The output signal $V_o$ of the amplifier 800' is 0 during the second time period t2 and the fourth time period t4. Since the output signal $V_o$ of the amplifier 800' is 0 during the second time period t2 and the fourth time period t4, the noise which is introduced through the pressure sensor 450 can be removed during the first time period t1 and the third time period t3, and the noise which is introduced through the pressure sensor 450 can be minimized during the entire time period t1 to t4.

The amplifier 800' includes an operational amplifier (op-amp), a first capacitor C1 which is connected between the pressure sensing node $N_A$ and an inverting input terminal (−) of the operational amplifier and between the pressure sensing node $N_A$ and a non-inverting input terminal (+) of the operational amplifier, a second capacitor C2 which is connected between the inverting input terminal (−) of the operational amplifier and an output terminal of the operational amplifier and between a drive control voltage $V_{DRV}$ and the non-inverting input terminal (+) of the operational amplifier, and a switch ph3 which is connected to both ends of the second capacitor C2 connected between the drive control voltage $V_{DRV}$ and the non-inverting input terminal (+) of the operational amplifier. Here, the output terminal of the operational amplifier is connected to the output node $N_o$.

Figure 15:
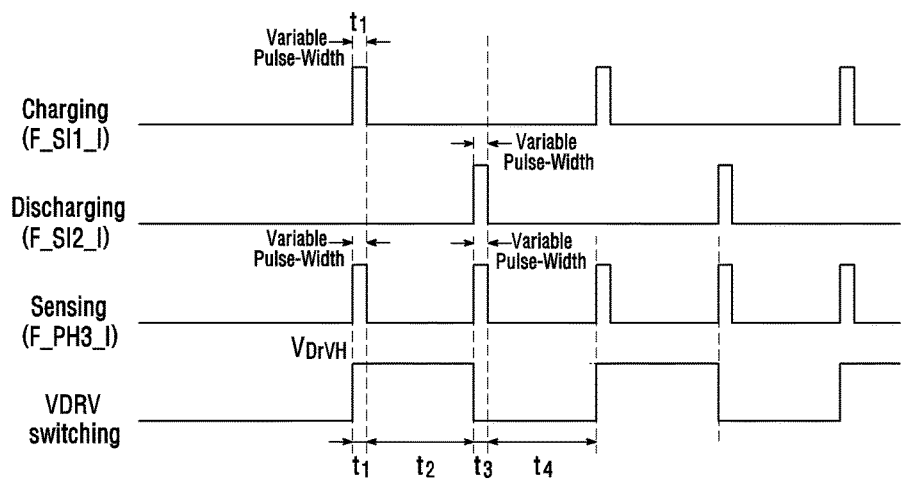
FIG. 15 is a timing diagram showing a current flowing through a first current source SI1, a second current source SI2, and a switch ph3 and a magnitude of a drive control voltage $V_{DRV}$ in accordance with the lapse of time in the pressure sensing circuit shown in FIG. 14.

FIG. 15 is a timing diagram showing a current flowing through the first current source SI1, the second current source SI2, and the switch ph3 and a magnitude of the drive control voltage $V_{DRV}$ in accordance with the lapse of time in the pressure sensing circuit shown in FIG. 14

The operations of the first current source SI1 and the second current source SI2 are the same as those described with reference to FIG. 10.

Every cycle, the switch ph3 is turned on during the first time period t1 and the third time period t3 and turned off during the second time period t2 and the fourth time period t4.

Every cycle, the drive control voltage $V_{DRV}$ is at a high level (2V) during the first time period t1 and the second time period t2 and is at a low level (0.5V) during the third time period t3 and the fourth time period t4. Here, the high level and the low level of the drive control voltage $V_{DRV}$ are not fixed values but adjustable values.

Figure 16:
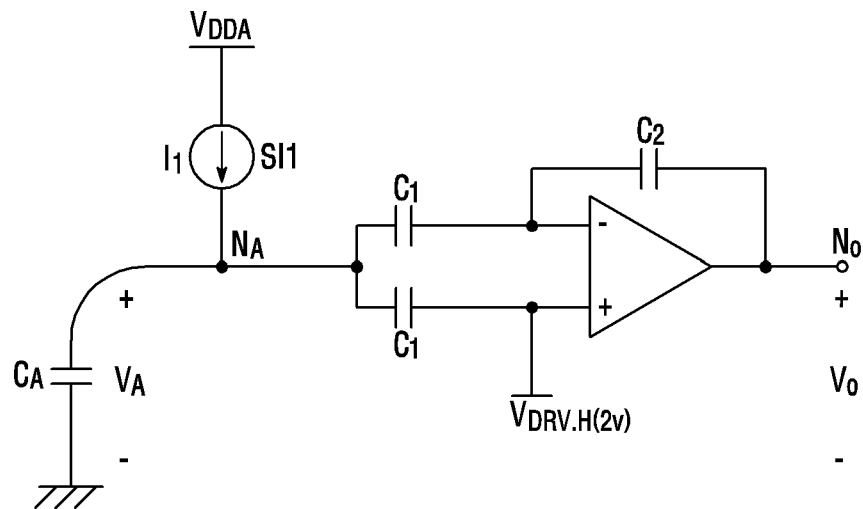
FIG. 16 shows an equivalent circuit of the pressure sensing circuit shown in FIG. 14 during a first time interval t1.
Figure 17:
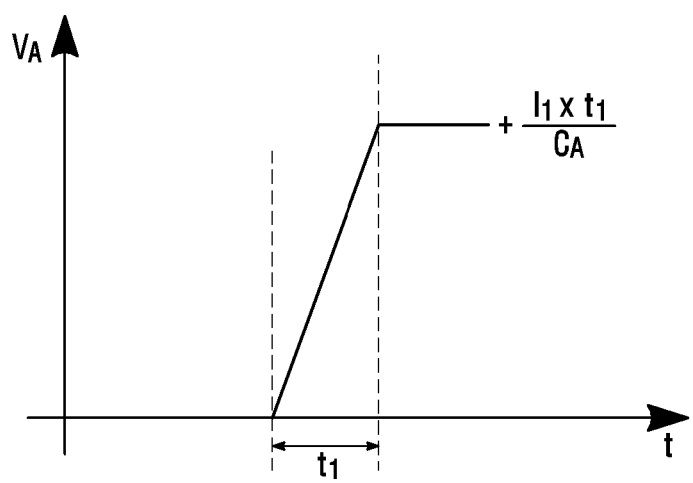
FIG. 17 is a voltage ($V_A$)-time (t) graph at a pressure sensing node $N_A$ of the pressure sensing circuit shown in FIG. 16.

FIG. 16 shows an equivalent circuit of the pressure sensing circuit shown in FIG. 14 during the first time period t1. FIG. 17 is a voltage ($V_A$)-time (t) graph at the pressure sensing node $N_A$ of the pressure sensing circuit shown in FIG. 16.

Referring to FIGS. 16 and 17, during the first time period t1, the first current source SI1 is turned on and the second current source SI2 is turned off, so that electric charges are charged in the pressure capacitor $C_A$, and thus, the voltage $V_A$ of the pressure sensing node $N_A$ increases. Also, during the second time period t2 after the first time period t1, a voltage corresponding to $$+\frac{I_1 \times t_1}{C_A}$$

is uniformly maintained.

Figure 18:
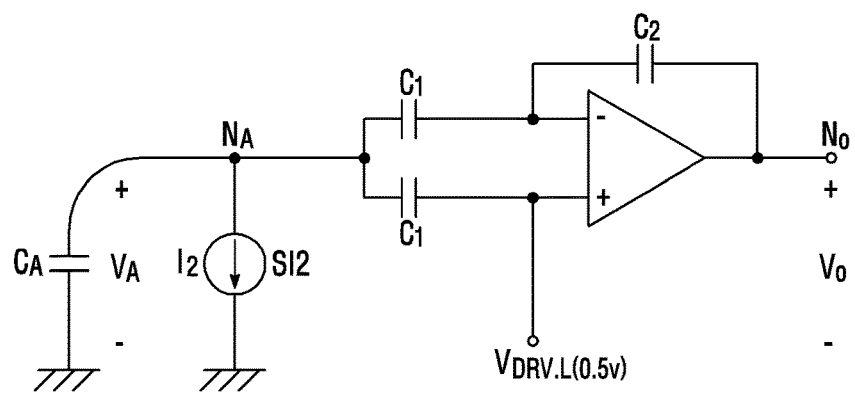
FIG. 18 shows an equivalent circuit of the pressure sensing circuit shown in FIG. 14 during a third time period t3.
Figure 19:
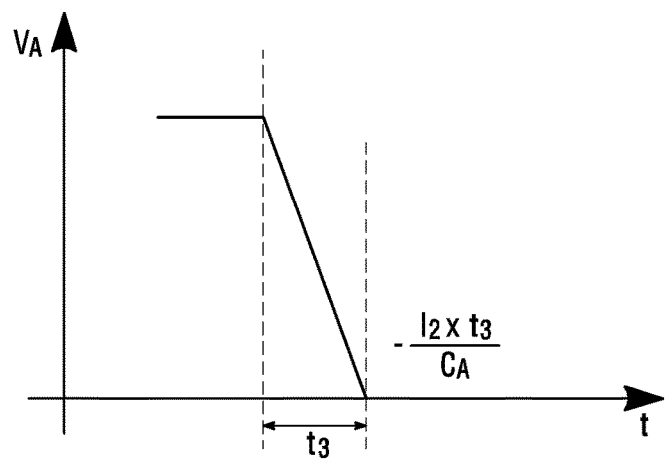
FIG. 19 is a voltage ($V_A$)-time (t) graph at the pressure sensing node $N_A$ of the pressure sensing circuit shown in FIG. 18.

FIG. 18 shows an equivalent circuit of the pressure sensing circuit shown in FIG. 14 during the third time period t3. FIG. 19 is a voltage ($V_A$)-time (t) graph at the pressure sensing node $N_A$ of the pressure sensing circuit shown in FIG. 18.

Referring to FIGS. 18 and 19, during the third time period t3, the first current source SI1 is turned off and the second current source SI2 is turned on, so that electric charges charged in the pressure capacitor $C_A$ are discharged, and thus, the voltage $V_A$ of the pressure sensing node $N_A$ decreases. Also, during the fourth time period t4 after the third time period t3, a voltage obtained by subtracting a predetermined voltage $$+\frac{I_2 \times t_3}{C_A}$$

from the voltage $$+\frac{I_1 \times t_1}{C_A}$$

during the second time period t2 is uniformly maintained.

Figure 20:
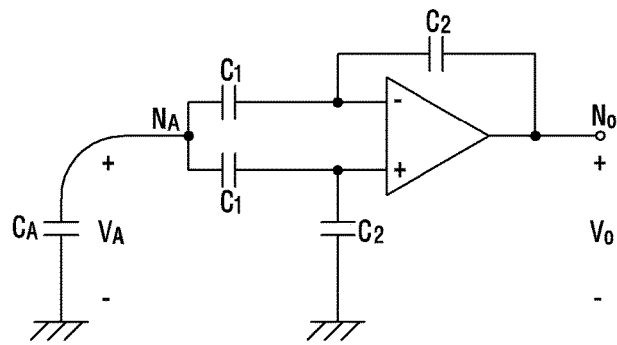
FIG. 20 shows an equivalent circuit of the pressure sensing circuit shown in FIG. 14 during a second time period t2 and a fourth time period t4.

FIG. 20 shows an equivalent circuit of the pressure sensing circuit shown in FIG. 14 during the second time period t2 and the fourth time period t4.

Referring to FIG. 20, the output signal $V_o$ during the second time period t2 and the fourth time period t4 is represented the following equation (6).

$$V_0 = \left(-\frac{C_1}{C_2}\right) \cdot V_A + \left(\frac{C_1}{C_1+C_2}\right)\left(1 + \frac{C_1}{C_2}\right) \cdot V_A = 0 \quad \text{Equation (6)}$$

Referring to equation (6) above, the output signal $V_o$ during the second time period t2 and the fourth time period t4 is 0 as described above.

Meanwhile, the pressure sensing circuit according to the third embodiment of the present invention shown in FIG. 14 may be the pressure sensing circuit according to the first embodiment of the present invention shown in FIG. 10 or may be obtained by further adding an amplifier 800' to the first modified example shown in FIG. 11 or to the second modified example shown in FIG. 12.

Figure 21:
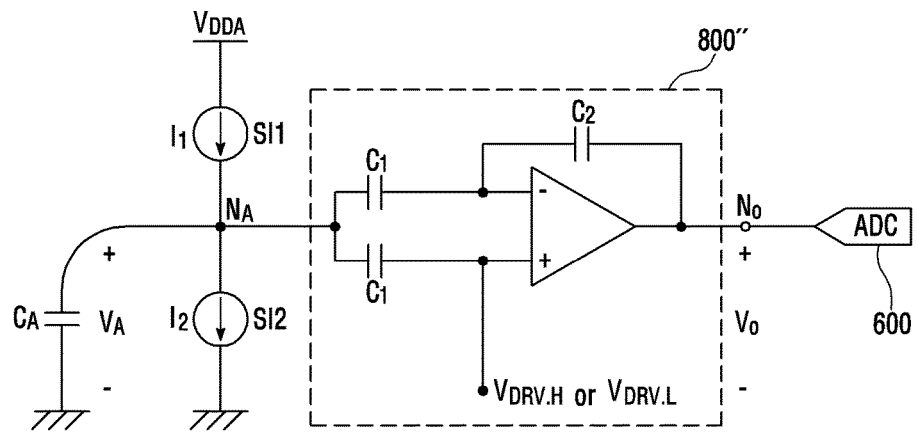
FIG. 21 shows the pressure sensing circuit according to a fourth embodiment of the present invention.
Figure 22:
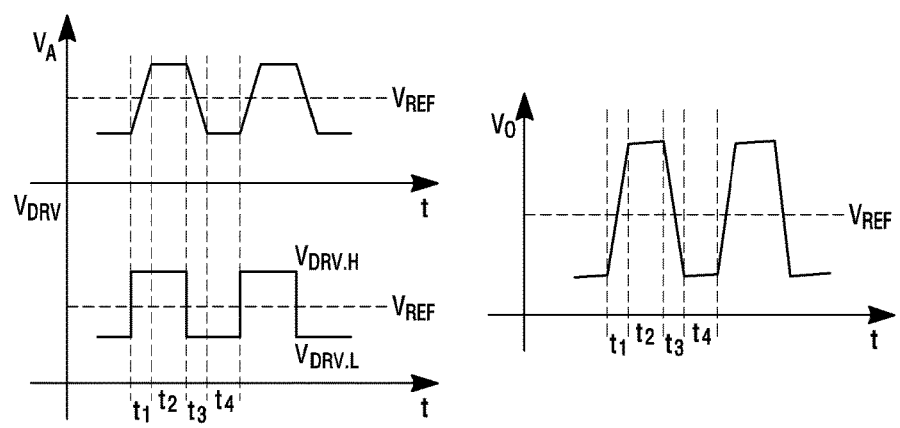
FIG. 22 is a graph showing the voltage $V_A$ of the pressure sensing node $N_A$, the drive control voltage $V_{DRV}$, and a voltage $V_o$ of an output node $N_o$ in the pressure sensing circuit shown in FIG. 21.

FIG. 21 shows the pressure sensing circuit according to a fourth embodiment of the present invention. FIG. 22 is a graph showing the voltage $V_A$ of the pressure sensing node $N_A$, the drive control voltage $V_{DRV}$, and the voltage $V_o$ of the output node $N_o$ in the pressure sensing circuit shown in FIG. 21.

The pressure sensing circuit shown in FIG. 21 according to the embodiment of the present invention is obtained by adding an amplifier 800" to the pressure sensing circuit shown in FIG. 10 according to the first embodiment of the present invention.

The amplifier 800" is connected between the pressure sensing node $N_A$ and the output node $N_o$.

The amplifier 800" includes the operational amplifier (op-amp), the first capacitor C1 which is connected between the pressure sensing node $N_A$ and the inverting input terminal (−) of the operational amplifier and between the pressure sensing node $N_A$ and the non-inverting input terminal (+) of the operational amplifier, the second capacitor C2 which is connected between the inverting input terminal (−) of the operational amplifier and the output terminal of the operational amplifier, and a drive control voltage $V_{DRV.H}$ or $V_{DRV.L}$ which is connected to the non-inverting input terminal (+) of the operational amplifier. Here, the output terminal of the operational amplifier is connected to the output node $N_o$.

The drive control voltage $V_{DRV.H}$ or $V_{DRV.L}$ provides the voltage ($V_{DRV.H}$) of the high level to the non-inverting input terminal of the operational amplifier during the first time period t1 and the second time period t2, and provides the voltage ($V_{DRV.L}$) of the low level to the non-inverting input terminal of the operational amplifier during the third time period t3 and the fourth time period t4. Here, an intermediate value between the voltage ($V_{DRV.H}$) of the high level and the voltage ($V_{DRV.L}$) of the low level becomes a reference voltage $V_{REF}$.

Such an amplifier 800" amplifies the voltage $V_A$ of the pressure sensing node $N_A$ on the basis of the reference voltage $V_{REF}$.

Meanwhile, the pressure sensing circuit according to the fourth embodiment of the present invention shown in FIG. 21 may be the pressure sensing circuit according to the first embodiment of the present invention shown in FIG. 10 or may be obtained by further adding an amplifier 800" to the first modified example shown in FIG. 11 or to the second modified example shown in FIG. 12.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A touch input device which detects a pressure magnitude of an input touch, the touch input device comprising:
    a display module;
    a substrate which is disposed under the display module;
    a pressure sensor which is disposed between the display module and the substrate; and
    a pressure sensing circuit which outputs a predetermined voltage,
        wherein the touch input device detects the pressure magnitude on the basis of the voltage output from the pressure sensing circuit,
        wherein the pressure sensing circuit comprises:
            a pressure sensing node $N_A$ which has the same voltage as a voltage applied to the pressure sensor;
            a switch serially connected between a power voltage $V_{DDA}$ and the pressure sensing node;
            a current source serially connected between the pressure sensing node and the ground; and
            an output node $N_o$ which is connected to the pressure sensing node and outputs an output signal,
        wherein the current source and the switch are turned on and turned off one or more times every cycle, wherein the current source is turned on during a first time period t1 every cycle, and wherein the switch is turned on every cycle during a third time period t3 separated from the first time period t1 by a predetermined time period.

2. The touch input device of claim 1,
    wherein the substrate comprises a reference potential layer,
    wherein the pressure sensor is spaced apart from the reference potential layer by a predetermined interval,
    and wherein the pressure sensor is disposed within the display module, or directly formed on a bottom surface of the display module or the substrate.

3. The touch input device of claim 1,
    wherein the substrate comprises a reference potential layer,
    wherein the pressure sensor is spaced apart from the reference potential layer by a predetermined interval,
    wherein touch input device comprises a sensor sheet which comprises the pressure sensor,
    and wherein the sensor sheet is attached to a bottom surface of the display module or the substrate.

4. The touch input device of claim 1,
    wherein, every cycle, a second predetermined time period exists between the first time period t1 and the third time period t3, and a fourth time period t4 exists between the third time period t3 and the first time period t1 of the next cycle,
    and wherein the switch and the current source are turned off during the second time period and the fourth time period.

5. The touch input device of claim 1, wherein the pressure sensing circuit further comprises an amplifier connected between the pressure sensing node $N_A$ and the output node $N_o$.

6. The touch input device of claim 5, wherein the amplifier operates as an inverting amplifier or a non-inverting amplifier during the first time period t1 and the third time period t3, and operates as a differential amplifier during the second time period t2 between the first time period t1 and the third time period t3 and during the fourth time period t4 between the third time period t3 and the first time period t1 of the next cycle.

7. The touch input device of claim 6, wherein a voltage of the output signal is 0 during the second time period t2 and the fourth time period t4.

8. The touch input device of claim 5, wherein the amplifier comprises:
an operational amplifier (op-amp) which comprises an inverting input terminal (−), a non-inverting input terminal (+), and an output terminal;
a first capacitor C1 which is connected between the pressure sensing node $N_A$ and the inverting input terminal (−) and between the pressure sensing node $N_A$ and the non-inverting input terminal (+);
a second capacitor C2 which is connected between the inverting input terminal (−) and the output terminal and between the non-inverting input terminal (+) and a drive control voltage $V_{DRV}$; and
a switch ph3 which is connected to both ends of the second capacitor C2,
wherein the output terminal is connected to the output node $N_o$,
wherein, the switch ph3 is turned on during the first time period t1 and the third time period t3 and turned off during the second time period t2 between the first time period t1 and the third time period t3 and during the fourth time period t4 between the third time period t3 and the first time period t1 of the next cycle,
and wherein the drive control voltage $V_{DRV}$ is at a high level during the first time period t1 and the second time period t2 and is at a low level during the third time period t3 and the fourth time period t4.

9. The touch input device of claim 5, wherein the amplifier comprises:
an operational amplifier (op-amp) which comprises an inverting input terminal (−), a non-inverting input terminal (+) to which a drive control voltage $V_{DRV}$ is applied, and an output terminal;
a first capacitor C1 which is connected between the pressure sensing node $N_A$ and the inverting input terminal (−) and between the pressure sensing node $N_A$ and the non-inverting input terminal (+); and
a second capacitor C2 which is connected between the inverting input terminal (−) and the output terminal,
wherein the output terminal is connected to the output node $N_o$,
and wherein the drive control voltage $V_{DRV}$ is at a high level during the first time period t1 and the second time period t2 and is at a low level during the third time period t3 between the second time period t2 and the fourth time period t4 and during the fourth time period t4 between the third time period t3 and the first time period t1 of the next cycle.

10. A touch input device which detects a pressure magnitude of an input touch, the touch input device comprising:
a display module;
a substrate which is disposed under the display module;
a pressure sensor which is disposed between the display module and the substrate; and
a pressure sensing circuit which outputs a predetermined voltage,
wherein the touch input device detects the pressure magnitude on the basis of the voltage output from the pressure sensing circuit,
wherein the pressure sensing circuit comprises:
a pressure sensing node $N_A$ which has the same voltage as a voltage applied to the pressure sensor;
a current source serially connected between a power voltage $V_{DDA}$ and the pressure sensing node;
a switch serially connected between the pressure sensing node and the ground; and
an output node $N_o$ which is connected to the pressure sensing node and outputs an output signal,
wherein the current source and the switch are turned on and turned off one or more times every cycle,
wherein the current source is turned on during a first time period t1 every cycle, and wherein the switch is turned on every cycle during a third time period t3 separated from the first time period t1 by a predetermined time period.

11. The touch input device of claim 10,
wherein the substrate comprises a reference potential layer,
wherein the pressure sensor is spaced apart from the reference potential layer by a predetermined interval,
and wherein the pressure sensor is disposed within the display module, or directly formed on a bottom surface of the display module or the substrate.

12. The touch input device of claim 10,
wherein the substrate comprises a reference potential layer,
wherein the pressure sensor is spaced apart from the reference potential layer by a predetermined interval,
wherein touch input device comprises a sensor sheet which comprises the pressure sensor,
and wherein the sensor sheet is attached to a bottom surface of the display module or the substrate.

13. The touch input device of claim 10,
wherein, every cycle, a second predetermined time period exists between the first time period t1 and the third time period t3, and a fourth time period t4 exists between the third time period t3 and the first time period t1 of the next cycle,
and wherein the switch and the current source are turned off during the second time period and the fourth time period.

14. The touch input device of claim 10, wherein the pressure sensing circuit further comprises an amplifier connected between the pressure sensing node $N_A$ and the output node $N_o$.

15. The touch input device of claim 14, wherein the amplifier operates as an inverting amplifier or a non-inverting amplifier during the first time period t1 and the third time period t3, and operates as a differential amplifier during the second time period t2 between the first time period t1 and the third time period t3 and during the fourth time period t4 between the third time period t3 and the first time period t1 of the next cycle.

16. The touch input device of claim 15, wherein a voltage of the output signal is 0 during the second time period t2 and the fourth time period t4.

17. The touch input device of claim 14, wherein the amplifier comprises:
an operational amplifier (op-amp) which comprises an inverting input terminal (−), a non-inverting input terminal (+), and an output terminal;
a first capacitor C1 which is connected between the pressure sensing node $N_A$ and the inverting input terminal (−) and between the pressure sensing node $N_A$ and the non-inverting input terminal (+);

a second capacitor C2 which is connected between the inverting input terminal (−) and the output terminal and between the non-inverting input terminal (+) and a drive control voltage $V_{DRV}$; and a switch ph3 which is connected to both ends of the second capacitor C2, wherein the output terminal is connected to the output node $N_o$, wherein, the switch ph3 is turned on during the first time period t1 and the third time period t3 and turned off during the second time period t2 between the first time period t1 and the third time period t3 and during the fourth time period t4 between the third time period t3 and the first time period t1 of the next cycle, and wherein the drive control voltage $V_{DRV}$ is at a high level during the first time period t1 and the second time period t2 and is at a low level during the third time period t3 and the fourth time period t4.

18. The touch input device of claim 14, wherein the amplifier comprises:

an operational amplifier (op-amp) which comprises an inverting input terminal (−), a non-inverting input terminal (+) to which a drive control voltage $V_{DRV}$ is applied, and an output terminal;

a first capacitor C1 which is connected between the pressure sensing node $N_A$ and the inverting input terminal (−) and between the pressure sensing node $N_A$ and the non-inverting input terminal (+); and a second capacitor C2 which is connected between the inverting input terminal (−) and the output terminal, wherein the output terminal is connected to the output node $N_o$, and wherein the drive control voltage $V_{DRV}$ is at a high level during the first time period t1 and the second time period t2 and is at a low level during the third time period t3 between the second time period t2 and the fourth time period t4 and during the fourth time period t4 between the third time period t3 and the first time period t1 of the next cycle.

19. A touch input device which detects a pressure magnitude of an input touch, the touch input device comprising:

a display module;

a substrate which is disposed under the display module;

a pressure sensor which is disposed between the display module and the substrate; and a pressure sensing circuit which outputs a predetermined voltage, wherein the touch input device detects the pressure magnitude on the basis of the voltage output from the pressure sensing circuit, wherein the pressure sensing circuit comprises:

a pressure sensing node $N_A$ which has the same voltage as a voltage applied to the pressure sensor;

a first current source serially connected between a power voltage $V_{DDA}$ and the pressure sensing node;

a second current source serially connected between the first current source and the ground; and an output node $N_o$ which is connected to the pressure sensing node and outputs an output signal, wherein the first current source and the second current source are turned on and turned off one or more times every cycle, wherein the first current source is turned on during a first time period t1 every cycle, and wherein the second current source is turned on every cycle during a third time period t3 separated from the first time period t1 by a predetermined time period.

20. The touch input device of claim 19, wherein the substrate comprises a reference potential layer, wherein the pressure sensor is spaced apart from the reference potential layer by a predetermined interval, and wherein the pressure sensor is disposed within the display module, or directly formed on a bottom surface of the display module or the substrate.

21. The touch input device of claim 19, wherein the substrate comprises a reference potential layer, wherein the pressure sensor is spaced apart from the reference potential layer by a predetermined interval, wherein touch input device comprises a sensor sheet which comprises the pressure sensor, and wherein the sensor sheet is attached to a bottom surface of the display module or the substrate.

22. The touch input device of claim 19, wherein, every cycle, a second predetermined time period exists between the first time period t1 and the third time period t3, and a fourth time period t4 exists between the third time period t3 and the first time period t1 of the next cycle, and wherein the first current source and the second current source are turned off during the second time period and the fourth time period.

23. The touch input device of claim 22, wherein a first current I1 of the first current source SI1 and a second current I2 of the second current source SI2 have the same magnitude, wherein the first time period and the third time period are the same as each other, and wherein the second time period and the fourth time period are the same as each other.

24. The touch input device of claim 19, wherein the pressure sensing circuit further comprises an amplifier connected between the pressure sensing node $N_A$ and the output node $N_o$.

25. The touch input device of claim 24, wherein the amplifier operates as an inverting amplifier or a non-inverting amplifier during the first time period t1 and the third time period t3, and operates as a differential amplifier during the second time period t2 between the first time period t1 and the third time period t3 and during the fourth time period t4 between the third time period t3 and the first time period t1 of the next cycle.

26. The touch input device of claim 25, wherein a voltage of the output signal is 0 during the second time period t2 and the fourth time period t4.

27. The touch input device of claim 24, wherein the amplifier comprises:

an operational amplifier (op-amp) which comprises an inverting input terminal (−), a non-inverting input terminal (+), and an output terminal;

a first capacitor C1 which is connected between the pressure sensing node $N_A$ and the inverting input terminal (−) and between the pressure sensing node $N_A$ and the non-inverting input terminal (+);

a second capacitor C2 which is connected between the inverting input terminal (−) and the output terminal and between the non-inverting input terminal (+) and a drive control voltage $V_{DRV}$; and a switch ph3 which is connected to both ends of the second capacitor C2, wherein the output terminal is connected to the output node $N_o$, wherein, the switch ph3 is turned on during the first time period t1 and the third time period t3 and turned off during the second time period t2 between the first time period t1 and the third time period t3 and during the fourth time period t4 between the third time period t3 and the first time period t1 of the next cycle, and wherein the drive control voltage $V_{DRV}$ is at a high level during the first time period t1 and the second time period t2 and is at a low level during the third time period t3 and the fourth time period t4.

28. The touch input device of claim 24, wherein the amplifier comprises:

an operational amplifier (op-amp) which comprises an inverting input terminal (−), a non-inverting input terminal (+) to which a drive control voltage $V_{DRV}$ is applied, and an output terminal;

a first capacitor C1 which is connected between the pressure sensing node $N_A$ and the inverting input terminal (−) and between the pressure sensing node $N_A$ and the non-inverting input terminal (+); and a second capacitor C2 which is connected between the inverting input terminal (−) and the output terminal, wherein the output terminal is connected to the output node $N_o$, and wherein the drive control voltage $V_{DRV}$ is at a high level during the first time period t1 and the second time period t2 and is at a low level during the third time period t3 between the second time period t2 and the fourth time period t4 and during the fourth time period t4 between the third time period t3 and the first time period t1 of the next cycle.

* * * * *